United States Patent
Utsumi

(10) Patent No.: US 7,209,642 B1
(45) Date of Patent: Apr. 24, 2007

(54) TERMINAL APPARATUS AND RECORDING METHOD

(75) Inventor: Yoshimasa Utsumi, Tokyo (JP)

(73) Assignee: Sony Corporation, Tokyo (JP)

(*) Notice: Subject to any disclaimer, the term of this patent is extended or adjusted under 35 U.S.C. 154(b) by 782 days.

(21) Appl. No.: 09/658,141

(22) Filed: Sep. 8, 2000

(30) Foreign Application Priority Data

Sep. 10, 1999 (JP) ............................. P11-257107

(51) Int. Cl.
*H04N 5/91* (2006.01)
*G11B 15/04* (2006.01)

(52) U.S. Cl. ...................... 386/94; 386/46; 386/96; 358/401; 358/403; 358/444; 360/60

(58) Field of Classification Search ................ 386/94, 386/95, 125, 126, 83, 96, 45, 46; 395/442, 395/427, 430, 425; 358/444, 401, 403

See application file for complete search history.

(56) References Cited

U.S. PATENT DOCUMENTS

| | | | | |
|---|---|---|---|---|
| 5,131,091 A | * | 7/1992 | Mizuta | 713/200 |
| 5,590,306 A | * | 12/1996 | Watanabe et al. | 711/115 |
| 5,613,135 A | * | 3/1997 | Sakai et al. | 710/62 |
| 6,020,982 A | * | 2/2000 | Yamauchi et al. | 358/444 |
| 6,279,114 B1 | * | 8/2001 | Toombs et al. | 713/300 |
| 6,343,280 B2 | * | 1/2002 | Clark | 705/55 |
| 6,731,860 B1 | * | 5/2004 | Emoto | 386/52 |
| 6,731,863 B2 | * | 5/2004 | Ando et al. | 386/95 |

OTHER PUBLICATIONS

"SDMI Portable Device Specification," part 1, Jul. 8, 1999, Secure Digital Music Initiative, Los Angeles, XP002289704.
Anonymous: Jul. 9, 1999, Toshiba, Tokyo, Press Release XP002289703, Retrieved from the Internet: URL :www.toshiba.co.jp>.

* cited by examiner

*Primary Examiner*—Thai Q. Tran
*Assistant Examiner*—Jamie Jo Vent
(74) *Attorney, Agent, or Firm*—Frommer Lawrence & Haug LLP; William S. Frommer; Paul A. Levy

(57) ABSTRACT

A terminal apparatus comprising an insertion hole into which to insert a copyright-compliant first memory card and a copyright-noncompliant second memory card. The first and the second memory cards are substantially the same in shape. If the copyright-noncompliant second memory card is inserted preparatory to recording copyright-protected contents, the copyright-protected contents are recorded temporarily to the second memory card. When the copyright-compliant first memory card is later inserted, the recorded copyright-protected contents are transferred from the second memory card to the inserted first memory card. If the copyright-compliant first memory card is inserted preparatory to recording copyright-unprotected contents, the copyright-unprotected contents are recorded temporarily to the first memory card so that when the copyright-noncompliant second memory card is later inserted, the recorded copyright-unprotected contents are transferred from the first memory card to the inserted second memory card. Thus the desired contents are recorded unfailingly regardless of an inadvertent insertion by users of a memory card which is apparently the same in shape but different in type of copyright compliance.

17 Claims, 14 Drawing Sheets

TERMINAL APPARATUS AND RECORDING METHOD

BACKGROUND OF THE INVENTION

The present invention relates to a terminal apparatus capable of accommodating a copyright-compliant memory card and a copyright-noncompliant memory card which may be inserted together, as well as to a recording method for use with that terminal apparatus.

Today, there is a widespread practice of people gaining access through their PCs (personal computers) to desired servers on the WWW (Word Wide Web) network in order to download from there compressed digital data such as pieces of music or images to hard discs of the PCs for private entertainment.

Another practice becoming popular today involves connecting a portable terminal apparatus incorporating a nonvolatile memory such as a flash memory to the PC via an IEEE (The Institute of Electrical and Electronic Engineers) 1394-compatible cable or an interface such as RS (Recommended Standard)-232C or USB (Universal Standard Bus). Compressed digital data such as pieces of music and images are transferred or copied from the hard disc drive of the PC to the flash memory. The portable terminal apparatus accommodating such a nonvolatile memory is then carried around by users to enjoy recorded music or other contents illustratively in outdoor situations.

There has been concern that digital data downloaded via the Internet are illegally copied and distributed because copyright controls implemented through encryption and/or authorization are yet to be strictly enforced.

With a view to enforcing stricter copyright controls, copyright-compliant memory cards have been proposed which include a signal processing circuit for authorization and encryption (with decryption and modulation) in a nonvolatile memory.

The currently proposed copyright-compliant memory cards are substantially identical in shape to existing copyright-noncompliant memory cards. In terms of appearance, it is difficult to distinguish the two types of memory cards.

At present, there are two major types of portable terminal apparatuses proposed: one dedicated to recording dictations, and the other for recording music. The dictation recording portable terminal apparatus replaces tape media used conventionally on tape recorders with a memory card. The music recording portable terminal apparatus substitutes a memory card for such conventional storage media as optical discs including MD (mini-disc) and CD-R employed by recorders for dubbing music.

Another type of portable terminal apparatus is conceivable which addresses both dictations and music. Such an apparatus is feasible because the key components of the foregoing two types of portable terminal apparatuses are interchangeable.

The proposed copyright-compliant memory card and conventional copyright-noncompliant memory card are substantially the same in shape and thus indistinguishable from each other in appearance. This can lead to some inconveniences, such as users inadvertently inserting a copyright-noncompliant memory card preparatory to recording copyright-protected contents, or loading a copyright-compliant memory card for recording copyright-unprotected contents.

Where a copyright-noncompliant memory card is erroneously inserted in order to record copyright-protected contents, arrangements could be made to inhibit the recording so as to protect copyrights. However, this can cause unnecessary frustrations to well-meaning users who completed a proper charging process before attempting to download desired copyright-protected contents from a server via a personal computer, only to find that no recording would take place because the inserted memory card was not compliant with copyrights.

It may happen that a copyright-noncompliant memory card has been inserted inadvertently for encrypted recording of digital signals from a CD or other sources. In that case, unsuspecting users are led to believe that the digital signals are being correctly recorded while in fact arrangements for inhibiting such recording are at work, with no contents recorded. This is a disappointing experience to users.

While getting copyright-protected contents recorded, the user may come to realize that a copyright-noncompliant memory card has been inadvertently inserted. In that case, the user may supplement (or replace) the wrong card with a copyright-compliant memory card. However, the initial portion of the contents thought to have been recorded is already lost. If the user has duly completed a charging process to purchase copyright-protected contents, a failure to record the contents to an inadvertently inserted wrong memory card means the user must pay the charges again for another recording.

It may also happen that a copyright-compliant memory card is inadvertently inserted preparatory to recording copyright-unprotected contents. In that case, too, users are led to believe that important contents such as conference proceedings are being correctly recorded while in fact arrangements for inhibiting such recording are at work, with no contents recorded.

Furthermore, while getting copyright-unprotected contents recorded, the user may come to realize that a copyright-compliant memory card has been inadvertently inserted. In that case, the user may supplement (or replace) the wrong card with a copyright-noncompliant memory card. Again, the initial portion of the contents thought to have been recorded is already lost.

When copyright-compliant memory cards aimed at protecting copyrights are commercialized, users may experience some of the inconveniences outlined above due to the difficulty in distinguishing copyright-compliant and copyright-noncompliant memory cards. This may turn out to be an impediment to promoting the use of such memory cards.

SUMMARY OF THE INVENTION

The present invention has been made in view of the above circumstances and provides a terminal apparatus and a recording method, the apparatus being capable of accommodating a copyright-compliant and a copyright-noncompliant memory card in a correctly usable manner even though they are difficult to distinguish in appearance.

In carrying out the invention and according to one aspect thereof, there is provided a terminal apparatus comprising: an insertion hole into which to insert a first memory card for recording copyright-protected contents and a second memory card for recording copyright-unprotected contents, the first and the second memory card being substantially the same in shape; a judging element for judging whether a memory card inserted into the insertion hole is either the first memory card or the second memory card; a recording element which, if the judging element judges that the first memory card is inserted preparatory to recording copyright-unprotected contents, then records the copyright-unpro tected contents to the first memory card; and a controlling element which, if the second memory card is inserted into the insertion hole after the recording element has recorded the copyright-unprotected contents to the first memory card, then transfers the recorded copyright-unprotected contents from the first memory card to the inserted second memory card.

According to another aspect of the invention, there is provided a terminal apparatus comprising: an insertion hole into which to insert a first memory card for recording copyright-protected contents and a second memory card for recording copyright-unprotected contents, the first and the second memory card being substantially the same in shape; a judging element for judging whether a memory card inserted into the insertion hole is either the first memory card or the second memory card; a recording element which, if the judging element judges that the second memory card is inserted preparatory to recording copyright-protected contents, then records the copyright-protected contents to the second memory card; and a controlling element which, if the first memory card is inserted into the insertion hole after the recording element has recorded the copyright-protected contents to the second memory card, then transfers the recorded copyright-protected contents from the second memory card to the inserted first memory card.

Other objects, features and advantages of the invention will become more apparent upon a reading of the following description and appended drawings.

DETAILED DESCRIPTION OF THE PREFERRED EMBODIMENTS

Figure 1:
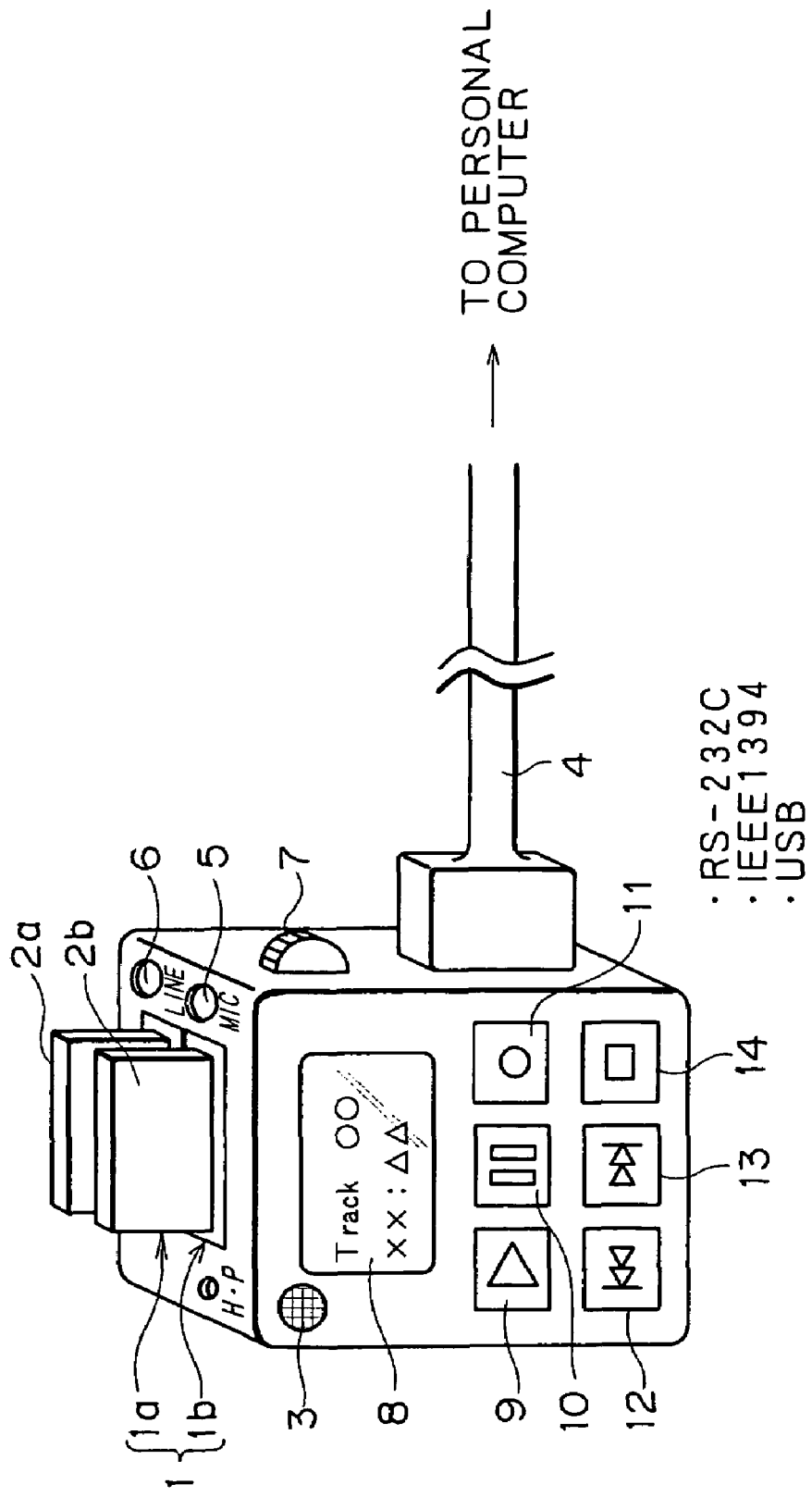
FIG. 1 is a schematic view sketching an appearance of a terminal apparatus capable of recording both dictations and music.

Preferred embodiments of this invention will now be described. FIG. 1 shows an outside view of a portable terminal apparatus embodying the invention.

The portable terminal apparatus in FIG. 1 has slots 1 (1a, 1b) capable of accommodating a plurality of memory cards. It is possible to insert into the slots 1 a copyright-compliant memory card 2a and a copyright-noncompliant memory card 2b which are substantially identical in appearance and shape.

The slots 1a and 1b are not dedicated respectively to accepting the copyright-compliant memory card 2a and copyright-noncompliant memory card 2b. That is, the slots 1a and 1b may accommodate two copyright-compliant memory cards 2a or two copyright-noncompliant memory cards 2b.

The multiple slots for simultaneously accommodating the multiple memory cards concurrently inserted make it easy to copy or relocate data from one memory card to another.

The portable terminal apparatus embodying the invention has two recording modes: dictation recording mode and music recording mode.

The dictation recording mode permits recording of audio signals such as those of conference proceedings picked up illustratively by a built-in microphone 3.

In the music recording mode, the portable terminal apparatus is connected to a PC (personal computer), not shown, via an RS (Recommended Standard)-232C cable, an IEEE 1394 cable, or a USB (Universal Standard Bus) cable 4. In this setup, compressed and encrypted audio signals held on a hard disc drive of the PC are transferred from there to a memory card inserted in the portable terminal apparatus.

In other words, the portable terminal apparatus of this invention is used for two purposes: as a recorder recording copyright-protected data sent from the personal computer or like sources, and as a recorder recording copyright-unprotected data entered illustratively through the microphone 3.

The portable terminal apparatus comprises a microphone terminal 5 to which an external microphone may be connected. Besides the built-in microphone 3, an additionally connected external microphone provides means for inputting copyright-unprotected data.

Also furnished is a line input terminal 6 that admits not only music data sent from the connected personal computer for recording but also audio data from such as a CD in an external CD player or like equipment, the latter audio data being made up of an unencrypted audio output signal. The line input terminal 6 provides means for inputting copyright-protected data which is not sent from the personal computer.

The portable terminal apparatus includes an output stream, not to be described hereunder in detail, of reproduced data (dictations, music) from the apparatus. The output stream may comprise a headphone terminal (HP) shown in FIG. 1, a line output terminal, and/or a built-in speaker.

A user interface of this portable terminal apparatus comprises a display unit 8 and various controls.

The display unit 8 is constituted illustratively by a liquid crystal display (LCD) that shows a track name of the currently reproduced piece of music or file, titles of recorded pieces of music or of files, an elapsed time (playing time), and other information.

A jog dial 7 is provided for such operations by users as setting the dictation recording mode or music recording mode, entering characters to name recorded pieces of music or files, and selecting any one of the recorded pieces of music or files. These operations are accomplished by simply rotating the dial.

Also provided are a playback key 9, a hold key 10, a recording key 11, an FR key 12, an FF key 13, and a stop key 14. These controls are manipulated by users.

Figure 2:
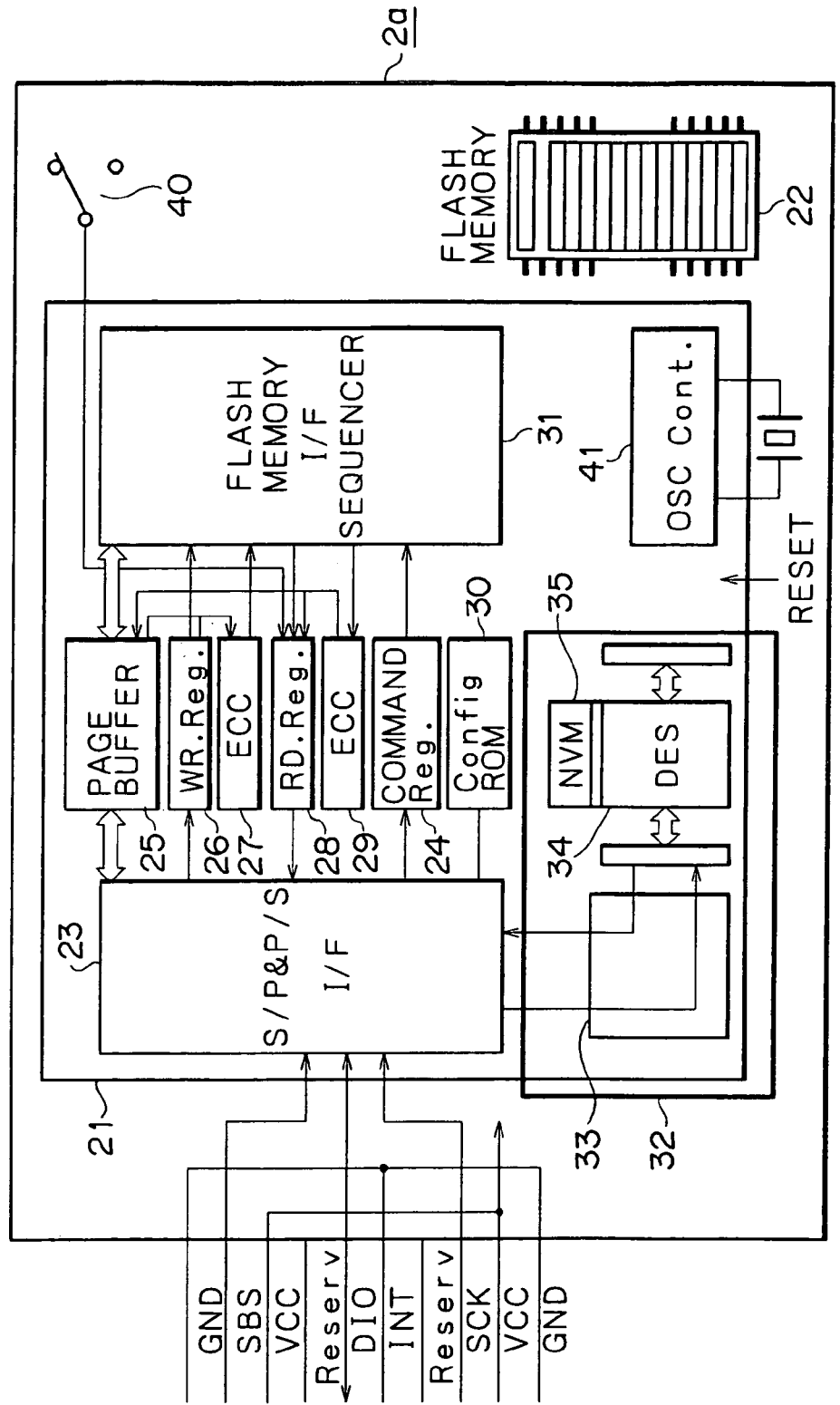
FIG. 2 is an internal block diagram of a copyright-compliant first memory card.

FIG. 2 is a block diagram of the copyright-compliant memory card 2a. The memory card 2a is a single-chip IC constituted by a control block 21 and a flash memory 22.

A bidirectional serial interface (i.e., memory interface 11) between the portable terminal apparatus and the memory card 2a is composed of 10 lines.

The interface lines include four principal lines: a clock line SCK for sending clock signals during data transmission, a status line SBS for sending status information, a data line DIO for transmitting data, and an interrupt line INT. Two ground lines GND and two power lines VCC are provided for power supply purposes. The remaining two lines (indicated as "Reserv") are reserved.

The clock line SCK is designed to send clock signals in synchronism with data. The status line SBS is intended to transmit a signal indicating the status of the memory card 2a.

The data line DIO is used to input and output commands and encrypted audio data. The interrupt line INT is a signal line over which the memory card 2a transmits to the portable terminal apparatus an interrupt signal requesting an interruption of the CPU in the terminal apparatus. The interrupt signal is generated when the memory card 2a is inserted. With this embodiment, however, the interrupt signal is actually sent over the data line DIO while the interrupt line INT is grounded and not used.

A serial/parallel and parallel/serial conversion interface block 23 (which may be abbreviated to S/P, P/S, I/F block) in the control block 21 provides an interface between the memory interface of the portable terminal apparatus on the one hand and the control block 21 of the memory card on the other hand. The portable terminal apparatus and the memory card are connected by means of the multiple lines described above.

The serial/parallel and parallel/serial conversion interface block 23 converts serial data received from the portable terminal apparatus into parallel data and feeds the converted parallel data to the control block 21. The interface block 23 also converts parallel data from the control block 21 into serial data and transfers the converted serial data to the portable terminal apparatus.

Furthermore, upon receiving commands and data over the data line DIO, the serial/parallel and parallel/serial conversion interface block 23 separates what is received into two groups: commands and data for ordinary access to the flash memory 22 on the one hand, and commands and data required for encryption on the other hand.

More specifically, a command arrives first followed by data in a format in which signals are sent over the data line DIO. The serial/parallel and parallel/serial conversion interface block 23 checks a code of a given command to determine whether the command and the ensuing data are needed for ordinary access or for encryption.

As a result of the check on the command code, any command needed for ordinary access is set to a command register 24 and the accompanying data are set to a page buffer 25 and to a write register 26. An error correcting code generating circuit 27 is provided in association with the write register 26. The error correcting code generating circuit 27 generates a redundant error correcting code with respect to the data held temporarily in the page buffer 25.

Output data from the command register 24, page buffer 25, write register 26, and error correcting code generating circuit 27 are supplied to a flash memory interface/sequencer 31 (which may be abbreviated to a memory I/F, sequencer). The flash memory interface/sequencer 31 provides an interface between the control block 21 and the flash memory 22, thus controlling data exchanges therebetween. Data are written to the flash memory 22 through this memory interface/sequencer 31.

For data reproduction from the memory card 2a, data retrieved from the flash memory 22 are sent through the flash memory interface/sequencer 31 to the page buffer 25, to a read register 28, and to an error correcting circuit 29. Any error in the data placed in the page buffer 25 is corrected by the error correcting circuit 29. Error-corrected output data from the page buffer 25 as well as output data from the read register 28 are fed to the serial/parallel and parallel/serial conversion interface block 23. From there, the data are sent through the above-mentioned serial interface to the CPU of the portable terminal apparatus.

A configuration ROM 30 is provided to accommodate information such as version information about the memory card 2a and various items of attribute information.

The memory card 2a is equipped with a switch 40 that may be operated by the user as needed to prevent inadvertent erasure. When the switch 40 is set to the erase inhibit position, the flash memory 22 is protected against erasure even if a command is sent from the portable terminal apparatus requesting erasure of data in the flash memory 22.

An oscillator 41 generates clock pulses providing a timing reference for processing by the memory card 2a.

The memory card 2a includes a security block 32 that implements a copyright protection function.

A security IC (an encryption device 60, to be described later) in the portable terminal apparatus and the security block 32 in the memory card 2a encrypt contents (i.e., audio data compressed as per ATRAC (Adaptive TRansform Acoustic Coding) 3, called ATRAC3 data hereunder) to be written to the flash memory 22 as a measure of copyright protection.

The security block 32 includes a buffer memory 33, a DES (Data Encryption Standard) encryption circuit 34 and a nonvolatile memory 35.

The security block 32 of the memory card 2a has a plurality of authorization keys and a storage key that is unique to the memory card in question.

The nonvolatile memory 35 accommodates keys needed for encryption and is thus rendered unreadable from the outside. Illustratively, the storage key is held in the nonvolatile memory 35.

The security block 32 also has a randomize circuit which permits authorization of the dedicated portable terminal apparatus (i.e., a terminal apparatus sharing a predetermined data format or the like within the system) sharing a session key with the card.

A content key for encrypting ATRAC3 data is encrypted by use of the session key and is transferred between the portable terminal apparatus and the memory card 2a. As with the security block 32 of the memory card 2a, the security block in the portable terminal apparatus has its own storage key. Illustratively, when encrypted contents are to be moved from one location to another, the content key is again encrypted using that storage key.

Figure 3:
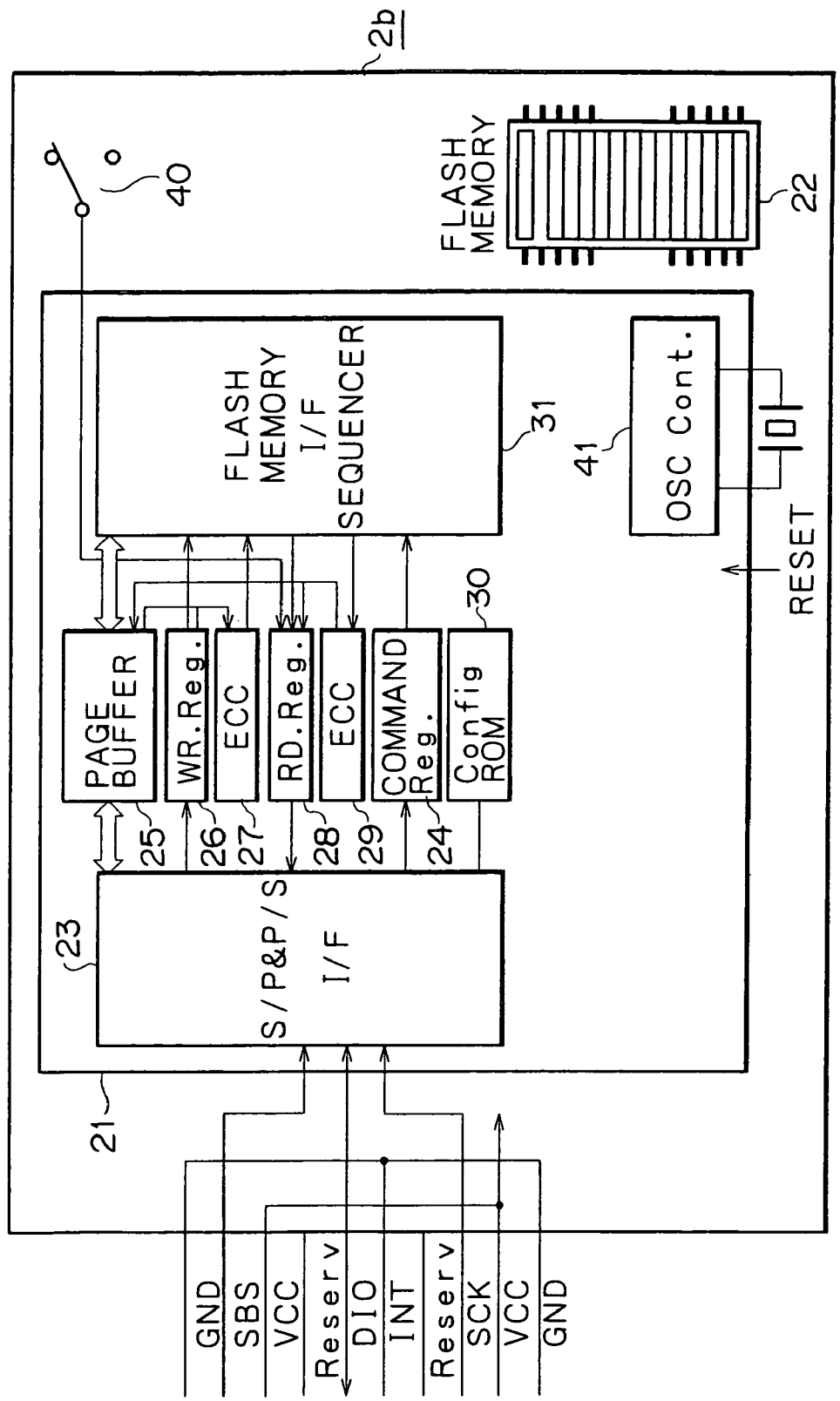
FIG. 3 is an internal block diagram of a copyright-noncompliant second memory card.

FIG. 3 is a block diagram of the copyright-noncompliant memory card 2b having no encryption function.

Compared with the memory card 2a in FIG. 2, the memory card 2b is shown having no security block 32 connected to a serial/parallel and parallel/serial conversion interface block 23. The remaining structural features are the same as those of the memory card 2a. Although not shown, the memory cards 2a and 2b are identical in shape and size.

The portable terminal apparatus in this example comprises an encryption device 60 and an authorization circuit 53, to be described later, and has a function for implementing security provisions regarding copyrights. Using that function, the portable terminal apparatus performs mutual authorization and key exchanges with the inserted memory card.

If the memory card 2b with no security block as shown in FIG. 3 is inserted into the portable terminal apparatus, the apparatus judges the inserted memory card to be copyright-noncompliant.

There are a number of methods by which the portable terminal apparatus determines whether the inserted card is a copyright-compliant memory card 2a or a copyright-noncompliant memory card 2b.

By one method, when a memory card is inserted into the portable terminal apparatus, the apparatus transmits a key to the inserted card for authorization. If the inserted memory card is the memory card 2b, the portable terminal apparatus fails to receive a normal response to the transmitted key from the card. That is, if the portable terminal apparatus does not obtain the normal response within a predetermined period of time following the key transmission, the terminal apparatus judges that the inserted memory card is a copyright-noncompliant card 2b.

Another method for determining the card type involves having security-compliance/noncompliance identification information stored in a suitable memory card area (i.e., boot area). When a memory card is inserted into the portable terminal apparatus, the terminal apparatus retrieves security-compliance/noncompliance identification information from data initially read from the boot area of the memory card. On the basis of the identification information thus retrieved, the portable terminal apparatus determines the type of the inserted memory card (as 2a or 2b).

Figure 4:
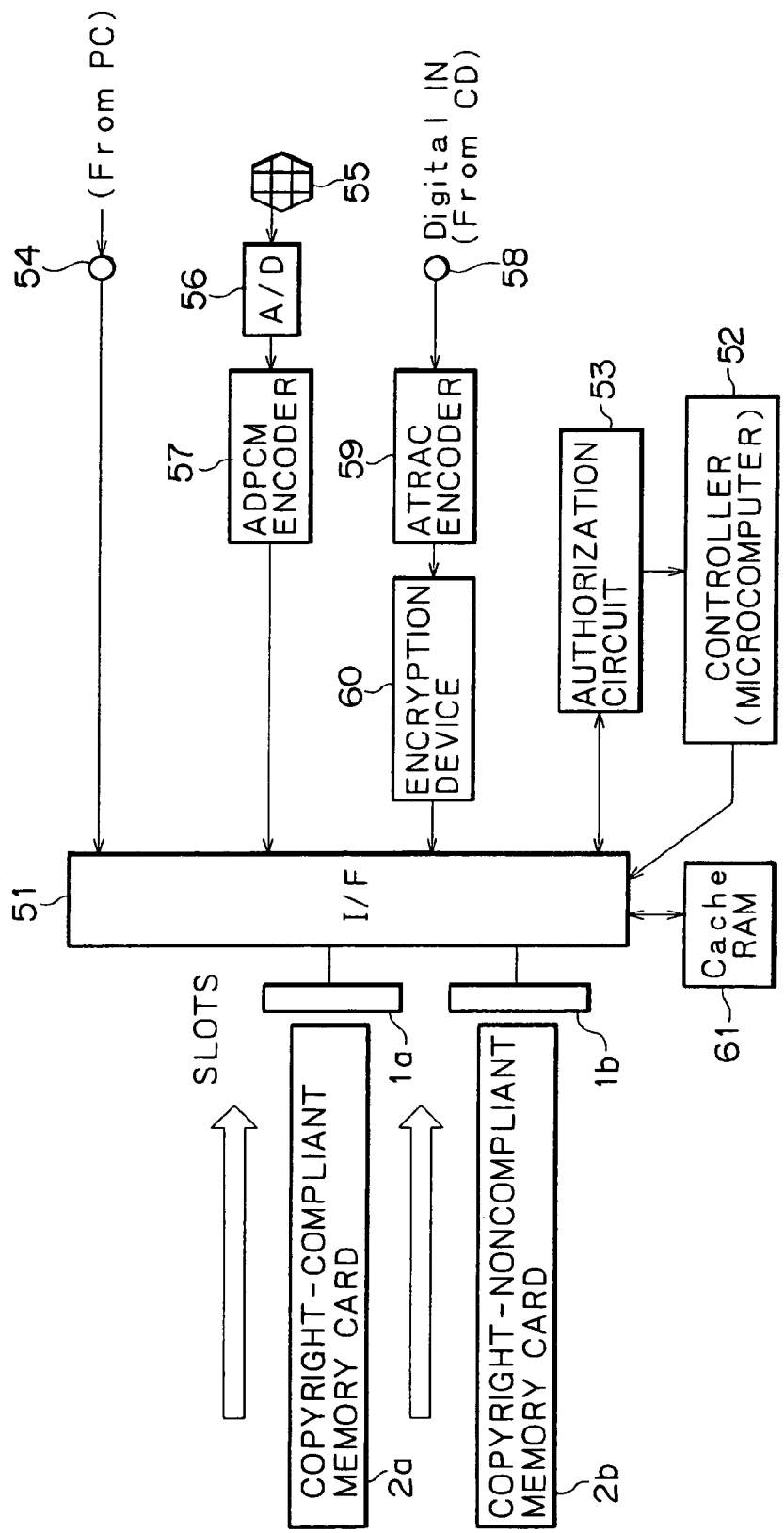
FIG. 4 is a block diagram of the inventive terminal apparatus as it accommodates both the copyright-compliant first memory card and the copyright-noncompliant second memory card.

FIG. 4 is a block diagram showing key components of the potable terminal apparatus embodying the invention. This block diagram omits an output stream constituted by circuits in the portable terminal apparatus for allowing reproduced data from memory cards to be output via headphones or transmitted to an external device connected to the terminal apparatus. Instead, the diagram depicts solely a recording stream made up of components for recording data to memory cards.

As illustrated, the portable terminal apparatus comprises an interface circuit 51, a controller 52, an authorization circuit 53, a connector 54, a microphone 55, an A/D converter 56, an ADPCM (Adaptive Differential Pulse Code Modulation) encoder 57, a line input terminal 58, an ATRAC encoder 59, an encryption device 60, and a cache RAM 61.

The interface circuit 51 provides interface processing between memory cards inserted in the slots 1a and 1b on the one hand, and the circuits of the terminal apparatus on the other hand.

The controller 52 is constituted by a microcomputer and provides overall controls.

The authorization circuit 53 performs an authorization process on memory cards as part of the copyright protection function. The encryption device 60 encrypts data as another part of the copyright protection function.

The cache RAM 61 holds data temporarily as they are being handled in any one of various processes. Illustratively, the cache RAM 61 is used as a temporary buffer in moving data between the copyright-compliant memory card 2a and the copyright-noncompliant memory card 2b, as will be described later.

The ADPCM (Adapted Pulse Code Modulation) encoder 59 compresses supplied data through ADPCM for conversion to an ADPCM signal.

The ATRAC (Adaptive Transform Acoustic Coding) encoder 59 compresses supplied data through ATRAC for conversion to an ATRAC signal.

The connector 54 is connected with the cable 4 shown in FIG. 1, whereby the portable terminal apparatus is connected to a personal computer. Through the connector 54, the portable terminal apparatus receives recorded data from the personal computer. The received data may illustratively be audio data that have been ATRAC-encoded and encrypted. Where the personal computer is connected to the network and the user has duly completed a charging process, compressed and encrypted music data may be downloaded over the Internet and received through the connector 54.

The microphone 55 corresponds to the microphone 3 shown in FIG. 1. As such, the microphone 55 provides an audio signal (analog audio signal) picked up as an external audio signal.

The line input terminal 58 corresponds to the line input terminal 6 depicted in FIG. 1. A digital audio signal is input through this terminal from an external device (such as a CD player, an MD player, digital broadcast tuner, etc.). The digital audio signal is typically made of data with a quantized bit count of 16 bits and sampled at 44.1 kHz.

Either the copyright-compliant memory card 2a or the copyright-noncompliant memory card 2b is selectively inserted into the slot 1a or 1b of this portable terminal apparatus. When the memory card 2a or 2b is inserted into the slot 1a or 1b, an authorization process takes place between the inserted memory card and the authorization circuit 53 through the interface circuit 51.

As a result of the authorization process, the controller 52 judges the inserted memory card to be either the copyright-compliant memory card 2a or the copyright-noncompliant memory card 2b.

In the dictation recording mode described above, an analog audio signal entered through the microphone 55 (or from a microphone connected to the microphone input terminal 5 in FIG. 1) is converted by the A/D converter 56 into a digital audio signal. After the conversion, the digital audio signal is fed to the ADPCM encoder 59.

The ADPCM encoder 59 converts the received signal to an ADPCM signal, and sends the ADPCM signal as recording data to the inserted memory card via the interface circuit 51. Specific recording steps will be described later.

In the above-mentioned music recording mode, the connector 54 may be connected with an RS-232C cable, an IEEE 1394 cable or a USB cable coming from a personal computer. Over the connected cable, the connector 54 may receive an encrypted and compressed audio signal from the personal computer. The data thus received are fed as recording data to the inserted memory card through the interface circuit 51. Specific recording steps will be described later.

Also in the music recording mode, the line input terminal 58 may be connected with a data reproducing apparatus such as a CD player in order to receive a digital audio signal therefrom. The digital audio signal thus supplied is converted by the ATRAC encoder 59 into an ATRAC signal which in turn is encrypted by the encryption device 60. The encrypted signal is fed as recording data to the inserted memory card via the interface circuit 51. Specific recording steps will be described later.

Figure 5:
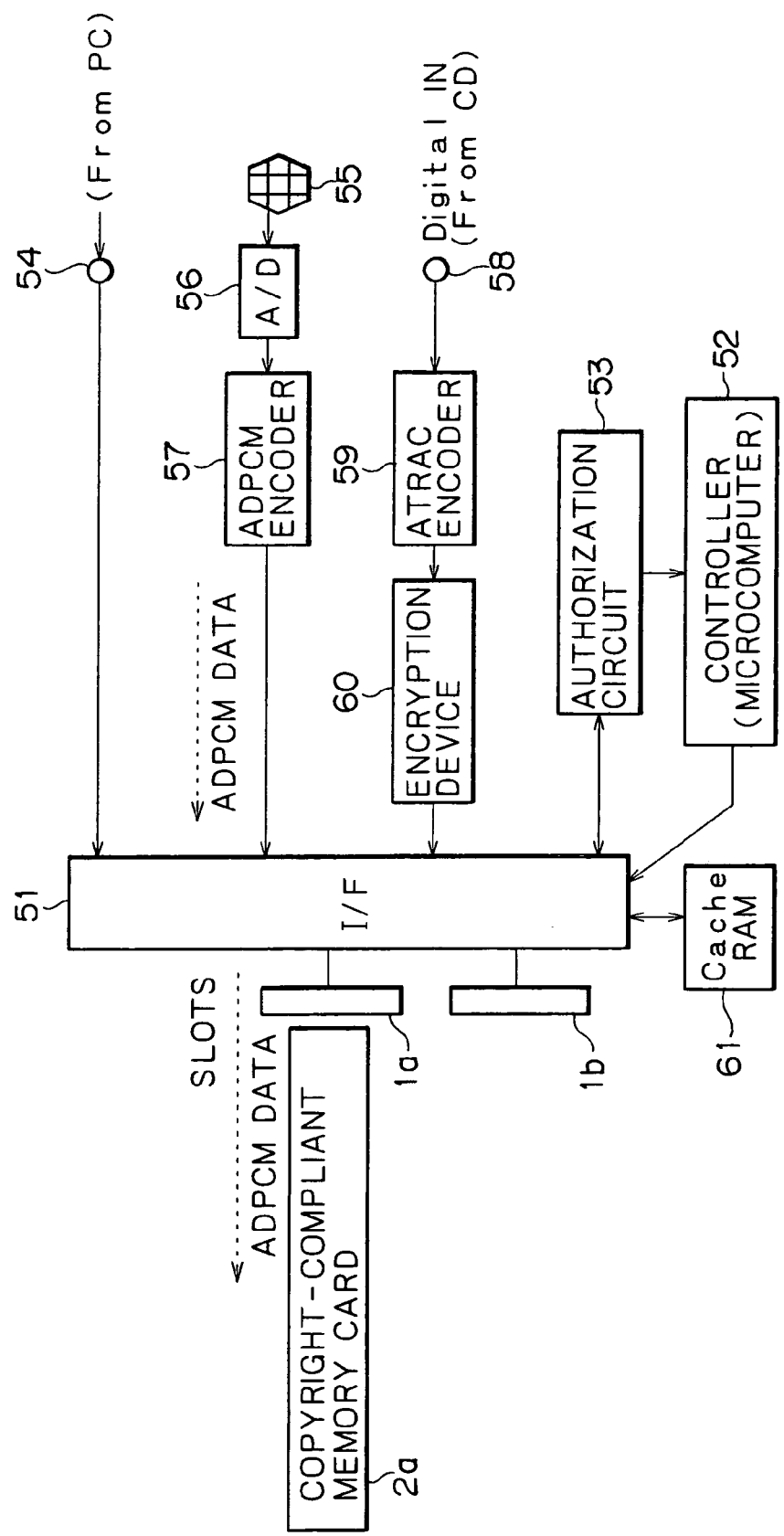
FIG. 5 is a block diagram of the inventive terminal apparatus, showing flows of recording signals with the copyright-compliant first memory card inserted in the apparatus for dictation recording.

A first operation example of this invention will now be described by referring to FIGS. 5 and 6. This example applies where the copyright-compliant memory card 2a is inserted with the dictation recording mode in effect. In FIGS. 4 and 5, those blocks with their equivalent or corresponding counterparts already shown in FIG. 4 are given the same reference numerals, and thick broken lines indicate flows of data.

FIG. 5 shows a case where the copyright-compliant memory card 2a is inserted into the slot 1a.

In the dictation recording mode, as described above, an analog audio signal entered from the microphone 55 is converted by the A/D converter 56 to a digital audio signal. The digital audio signal is further converted by the ADPCM encoder 59 into an ADPCM signal that is recorded to the inserted memory card via the interface circuit 51.

In that case, the data to be recorded are dictated audio data (constituting a dictation file) that are not subject to copyright protection. As such, the data should normally be recorded to the copyright-noncompliant memory card 2b. Since only the copyright-noncompliant memory card 2b is currently inserted, the data are recorded to the memory card 2a for the moment.

Whereas data are encrypted when normally recorded to the copyright-compliant memory card 2a, the dictation file above is recorded unencrypted as ADPCM data in the absence of that memory card 2b.

Figure 6:
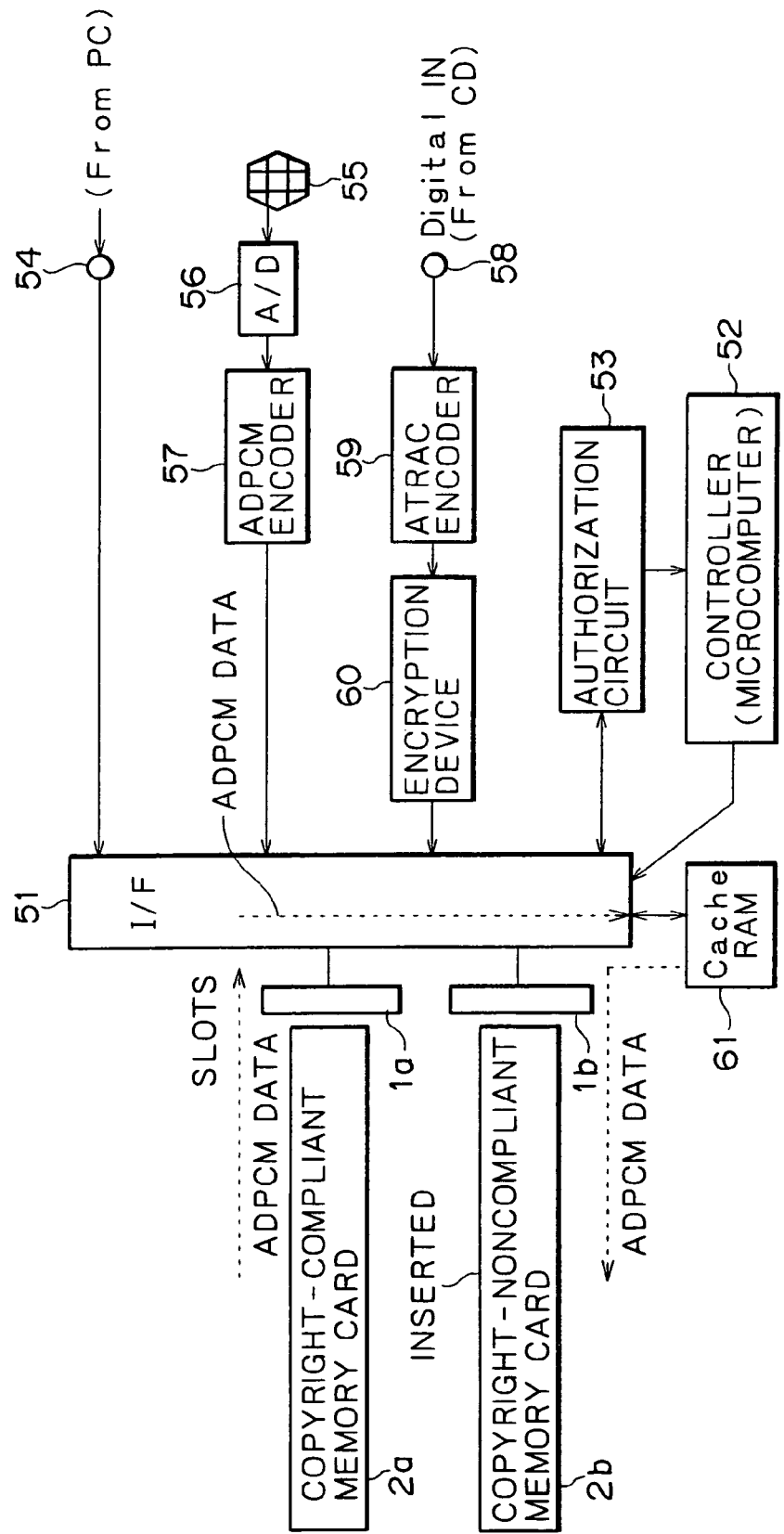
FIG. 6 is a block diagram of the inventive terminal apparatus for recording dictations, showing flows of recording signals from the currently inserted copyright-compliant first memory card to the newly inserted copyright-noncompliant second memory card.

After the dictation file has been recorded to the copyright-compliant memory card 2a, the apparatus waits until the copyright-noncompliant memory card 2b is inserted into the vacant slot 1b as shown in FIG. 6.

When the copyright-noncompliant memory card 2b is judged to have been inserted into the slot 1b, a check is made on the memory card 2b to see if it has a sufficient free area (i.e., writable area) to accommodate the recorded dictation file.

If a sufficient writable area is judged to exist in the added memory card 2b, the recorded ADPCM data are retrieved from the existing copyright-compliant memory card 2a as depicted in FIG. 6. The retrieved data are written temporarily to the cache RAM 61 via the interface circuit 51. From the cache RAM 61, the ADPCM data are read out in suitable increments and copied to the newly inserted copyright-noncompliant memory card 2b.

After being copied to the copyright-noncompliant memory card 2b, the ADPCM data (i.e., dictation file) in the copyright-compliant memory card 2a may be erased if so desired. If the data are erased, this completes relocation of the recorded data from one memory card to another.

Ordinarily, the copyright-compliant memory card 2a additionally equipped with the security block 32 as shown in FIG. 2 is sold at a higher price than the copyright-noncompliant memory card 2b. When the ADPCM data written temporarily to the copyright-compliant memory card 2a are erased after being relocated to the copyright-noncompliant memory card 2b, the expensive copyright-compliant memory card 2a can be used anew for other applications.

In the first operation example of this invention, as described, a copyright-compliant memory card 2a inadvertently inserted by the user in the dictation recording mode is arranged to accommodate temporarily the recorded data making up a dictation file. After the recording, the dictation file is relocated from the copyright-compliant memory card 2a to a newly inserted copyright-noncompliant memory card 2b.

Even if the memory card 2a is used mistakenly by the user for recording the dictated audio signal desired by the user (or if the memory card 2a is the only card available at the moment), the desired data are still recorded temporarily to the inserted memory card and thus will not be rejected thereby. This eliminates the inconvenience of being unable to record, say, important conference proceedings in the absence of a proper memory card.

Figure 7:
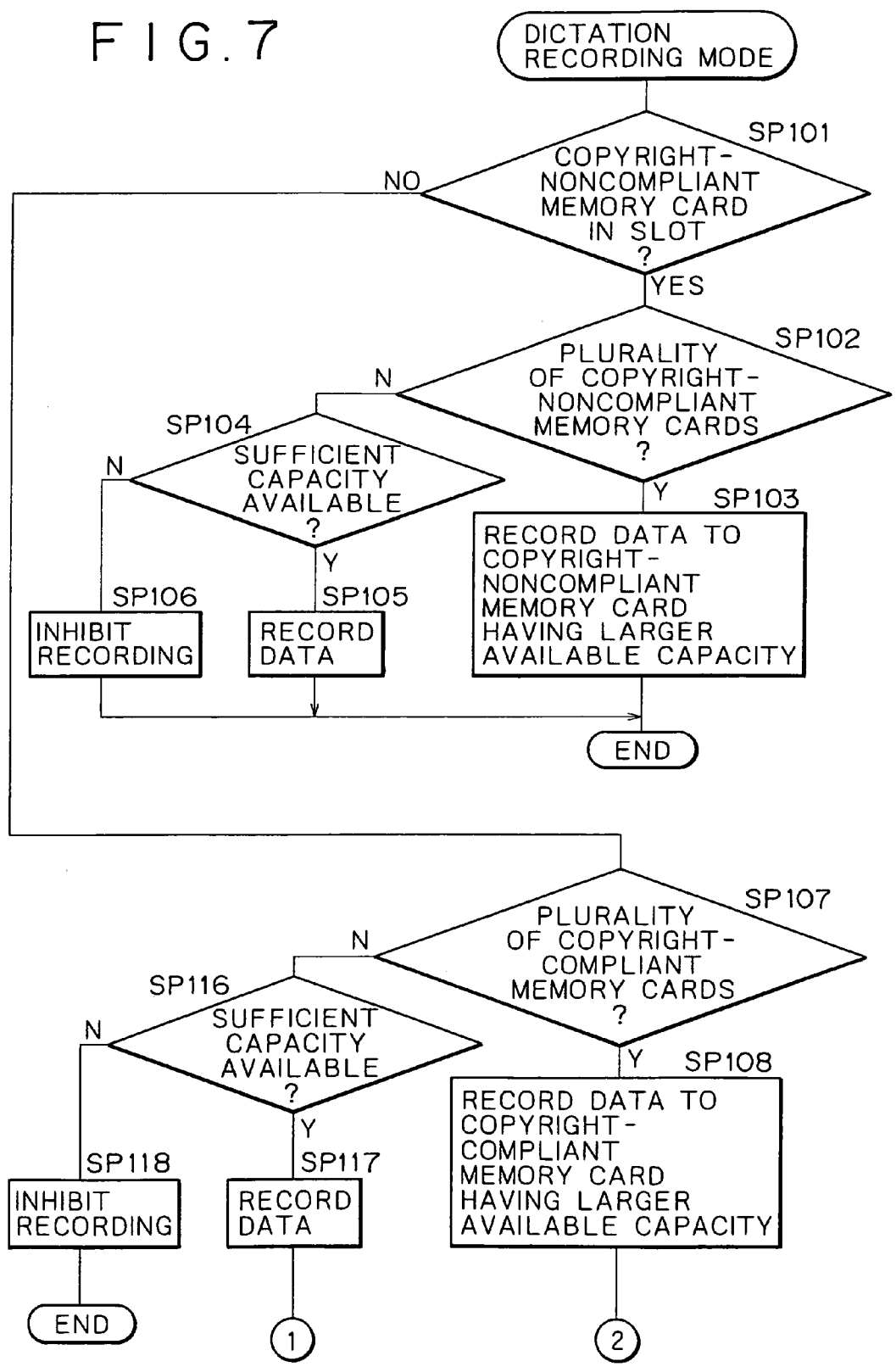
FIG. 7 is a flowchart of steps performed by the inventive terminal apparatus in a dictation recording mode.
Figure 8:
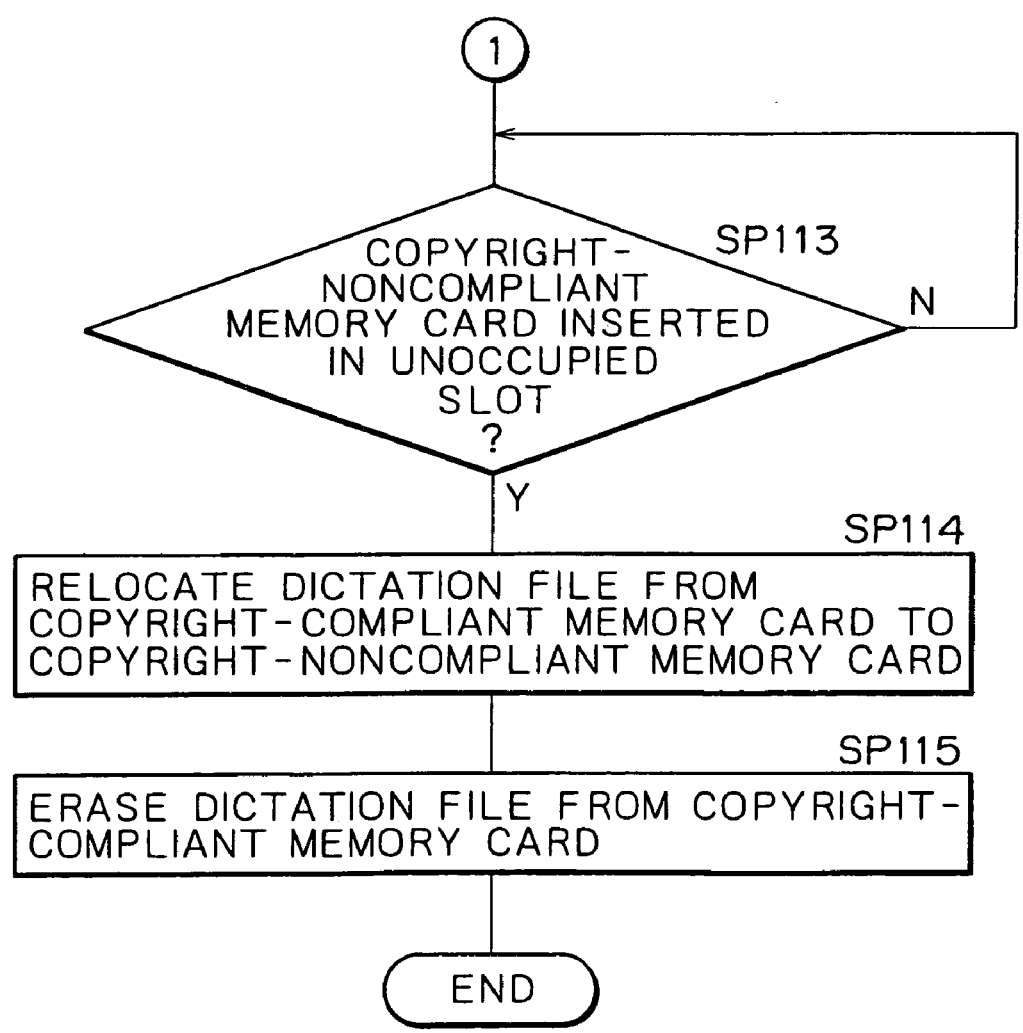
FIG. 8 is a flowchart of steps for relocating a dictation file from the copyright-compliant first memory card to the copyright-noncompliant second memory card.
Figure 9:
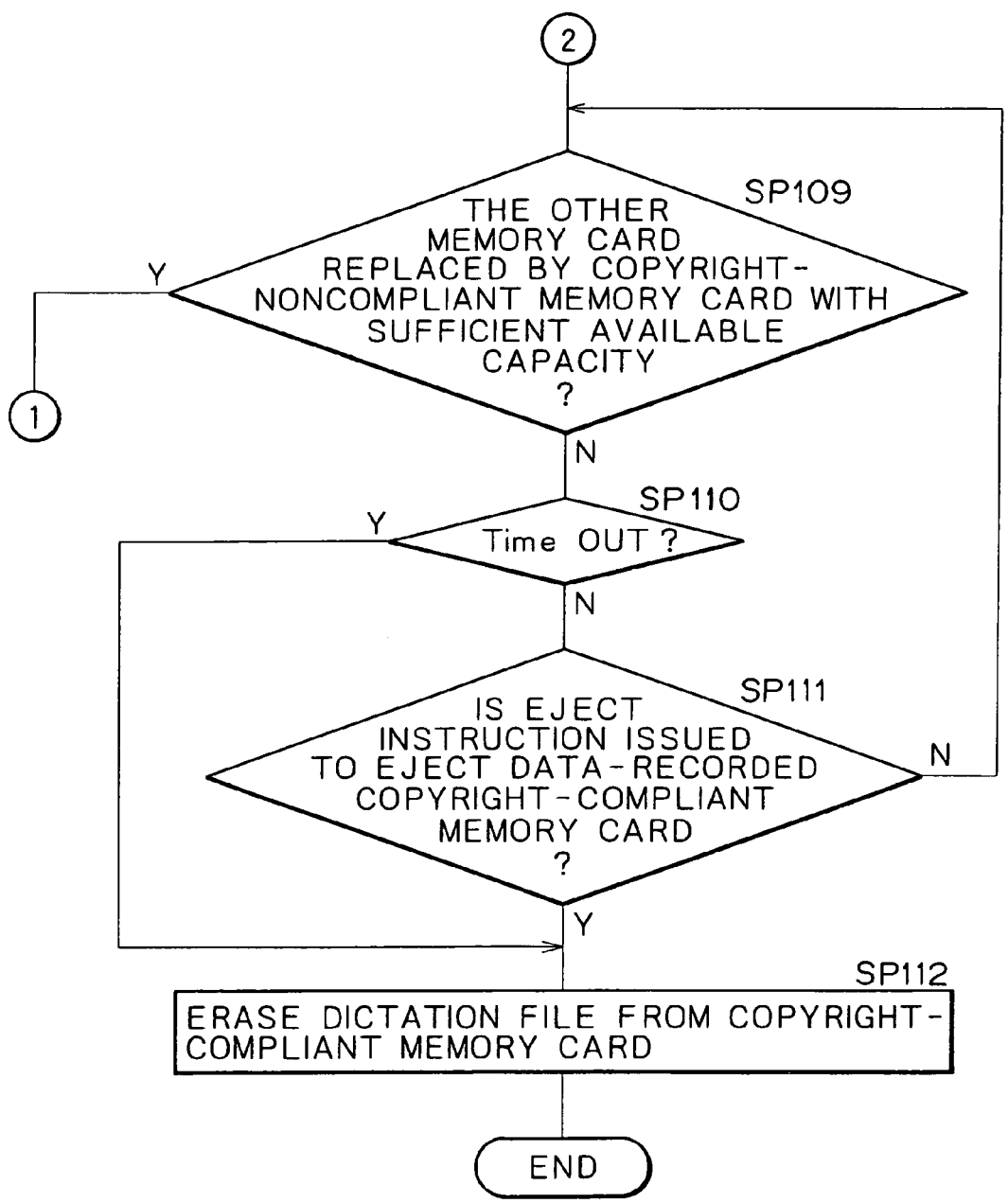
FIG. 9 is a flowchart of steps in effect when contents are not relocated from the copyright-compliant first memory card to the copyright-noncompliant second memory card.

FIGS. 7 through 9 are flowcharts of steps performed by the controller 52 in the first operation example (in dictation recording mode).

In step SP101, the controller 52 checks to see if a copyright-noncompliant memory card 2b has been inserted into one of the slots 1a and 1b.

If in step SP101 the copyright-noncompliant memory card 2b is found inserted in one of the slots, step SP102 is reached. In step SP102, a check is made to see if a plurality of copyright-noncompliant memory cards 2b have been inserted into the slots.

If in step SP102 a plurality of copyright-noncompliant memory cards 2b have been judged inserted, step SP103 is reached. In step SP103, the controller 52 starts recording a dictation file to one of the memory cards 2b which has the larger available capacity. The processing is terminated in response to a recording stop operation.

If in step SP102 a single copyright-noncompliant memory card 2b has been found inserted, step SP104 is reached. In step SP104, the controller 52 checks the available capacity of the memory card 2b. If the memory capacity is judged to be sufficient, the controller 52 goes to step SP105 and starts recording the dictation file. The processing is terminated in response to a recording stop operation.

If in step SP104 the available memory capacity is not judged to be sufficient, step SP106 is reached in which recording of the dictation file is inhibited. The processing is then terminated.

The steps above apply when the user has correctly inserted the copyright-noncompliant memory card or cards 2b in the dictation recording mode. The dictation file is recorded in keeping with the available capacity of the inserted memory card(s) 2b.

There may be a case in which, with the dictation recording mode in effect, the user has inserted a copyright-compliant memory card or cards 2a into one or both of the slots 1a and 1b in place of the copyright-noncompliant memory card(s) 2b. In that case, the processing of the controller 52 proceeds as follows:

In step SP101, the controller 52 may judge that a copyright-compliant memory card 2a alone is inserted in one of the slots 1a and 1b instead of a copyright-noncompliant memory card 2b. Following that judgment, the controller 52 goes to step SP107 to determine whether a plurality of copyright-compliant memory cards 2a are inserted into the slots 1a and 1b.

If in step SP107 the multiple copyright-compliant memory cards 2a have been judged inserted, step SP108 is reached. In step SP108, the controller 52 starts recording the dictation file to one of the memory cards 2a which has the larger available capacity.

At the end of the recording of the dictation file in step SP108, step SP109 in FIG. 9 is reached by way of exit ② in FIG. 7. In step SP109, the controller 52 waits until the other memory card not selected in step SP108, i.e., the copyright-compliant memory card 2a judged to have the smaller available capacity and not used for recording, is replaced by a new copyright-noncompliant memory card 2b with a sufficient available capacity.

In the wait state, the controller 52 counts the elapsed time using an internal timer. A time-out is monitored in step SP110.

In step SP111, a check is made to see if an eject instruction is issued illustratively by the user's operation in order to eject the copyright-compliant memory card 2a to which the data have been recorded.

It may happen that before a time-out is detected and before an eject instruction is issued to get the data-recorded copyright-compliant memory card 2a ejected, the data-unrecorded copyright-compliant memory card 2a is ejected from the slot; that a copyright-noncompliant memory card 2b is inserted into the vacated slot; and that the newly inserted memory card 2b is judged to have a sufficient available capacity. In that case, the processing of the controller 52 proceeds from step SP109 to step SP113 in FIG. 8 by way of exit ① in FIG. 9.

In step SP113, a check is made to see if the replacement detected in step SP109 has resulted in the insertion of a copyright-noncompliant memory card 2b. If the memory card 2b is judged to have been inserted, steps SP114 and SP115 are reached in which the dictation file recorded to the copyright-compliant memory card 2a in step SP108 is relocated from there to the newly inserted copyright-noncompliant memory card 2b.

More specifically, in step SP114, the dictation file is copied to the copyright-noncompliant memory card 2b as shown in reference to FIG. 6. In step SP115, the dictation file is erased from the copyright-compliant memory card 2a. This completes relocation of the dictation file from the memory card 2a to the memory card 2b, and the processing is terminated.

It may instead happen that a time-out is recognized in step SP110 without detection of the data-unrecorded copyright-compliant memory card 2a and the copyright-noncompliant memory card 2b being switched in step SP109, or that an eject instruction is detected in step SP111 to get the data-recorded copyright-compliant memory card 2a ejected. In such cases, the dictation file cannot be relocated as depicted in FIG. 8.

Step SP112 is then reached in which the dictation file is erased anyway from the data-recorded copyright-compliant memory card 2a. The erasure brings the processing to an end.

If, in step SP107 of FIG. 7, a single copyright-compliant memory card 2a is judged inserted in the dictation recording mode, step SP116 is reached in which the memory card 2a is checked for its available capacity. If the memory card 2a is judged to have a sufficient available capacity, step SP117 is reached. In step SP117, the controller 52 starts recording the dictation file to the copyright-compliant memory card 2a. If in step SP116 the available capacity of the memory card 2a is judged to be insufficient, step SP118 is reached in which recording of the dictation file is inhibited, and the processing is terminated.

At the end of the recording in step SP117, the processing of the controller 52 proceeds from step SP117 to step SP113 in FIG. 8 by way of exit ① in FIG. 7.

In step SP113, the controller 52 checks to see if (i.e., waits until) a copyright-noncompliant memory card 2b is inserted into the unoccupied slot.

If the copyright-noncompliant memory card 2b is judged inserted, steps SP114 and SP115 are reached in which the dictation file recorded to the copyright-compliant memory card 2a in step SP117 is relocated from there to the newly inserted copyright-noncompliant memory card 2b.

More specifically, in step SP114, the dictation file is copied to the copyright-noncompliant memory card 2b as shown in reference to FIG. 6. In step SP115, the dictation file is erased from the copyright-compliant memory card 2a. This completes relocation of the dictation file from the memory card 2a to the memory card 2b, and the processing is terminated.

The steps above are carried out in the dictation recording mode basically to record to the copyright-noncompliant memory card 2b the dictation file composed of audio signals picked up by the microphone 55 or the like. If a copyright-compliant memory card 2a alone is found inserted, the dictation file is recorded temporarily to that memory card 2a. Later, the recorded dictation file is relocated to a newly inserted copyright-noncompliant memory card 2b.

In the manner described, if the user inadvertently inserts a copyright-compliant memory card 2a, the desired dictation file can still be recorded despite the user's loading of the wrong type of memory card. The situation can be subsequently brought to normal when the dictation file is relocated to a copyright-noncompliant memory card 2b.

Figure 10:
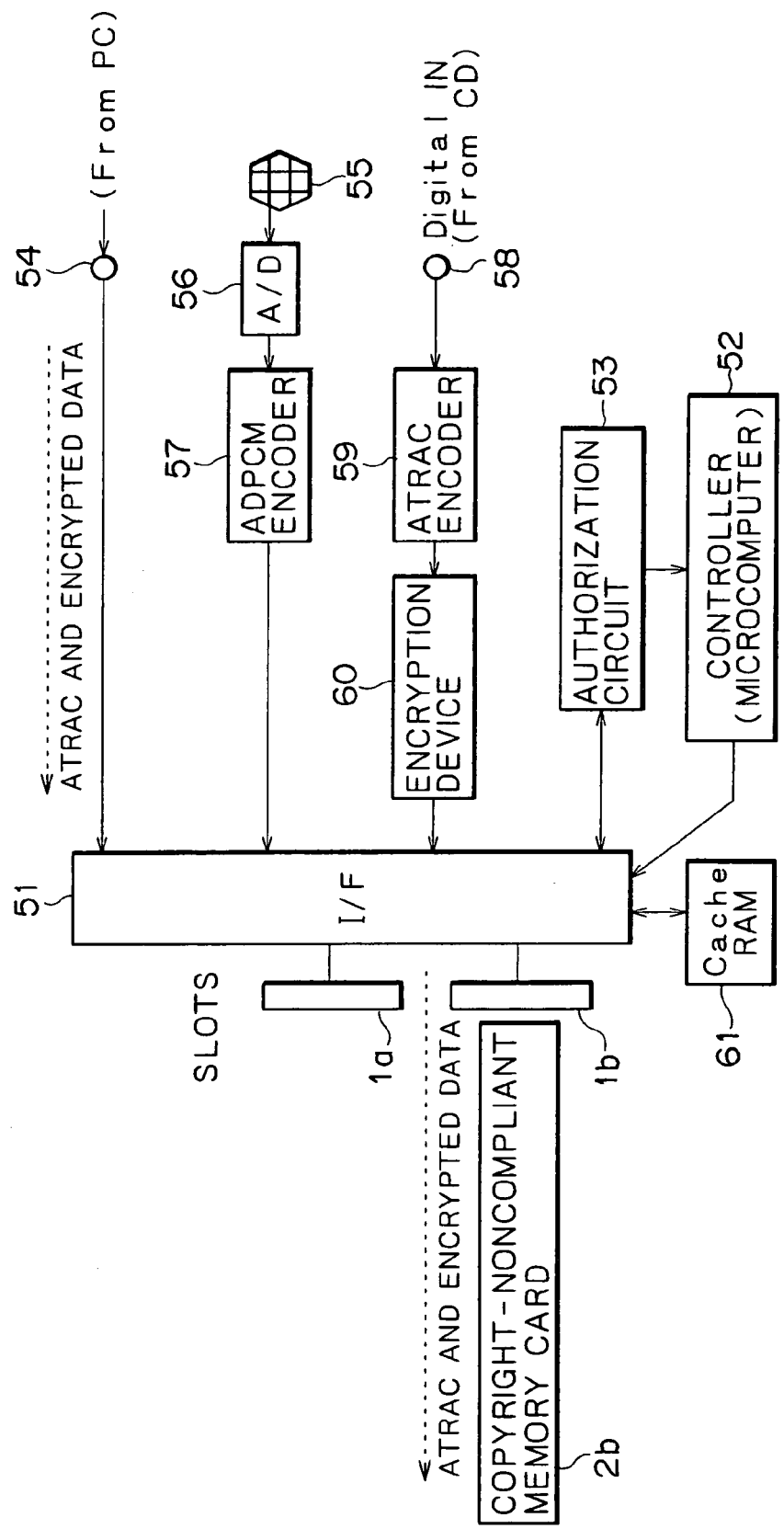
FIG. 10 is a block diagram of the inventive terminal apparatus in a music recording mode, showing flows of recording signals in effect with the copyright-noncompliant second memory card inserted in the apparatus.
Figure 11:
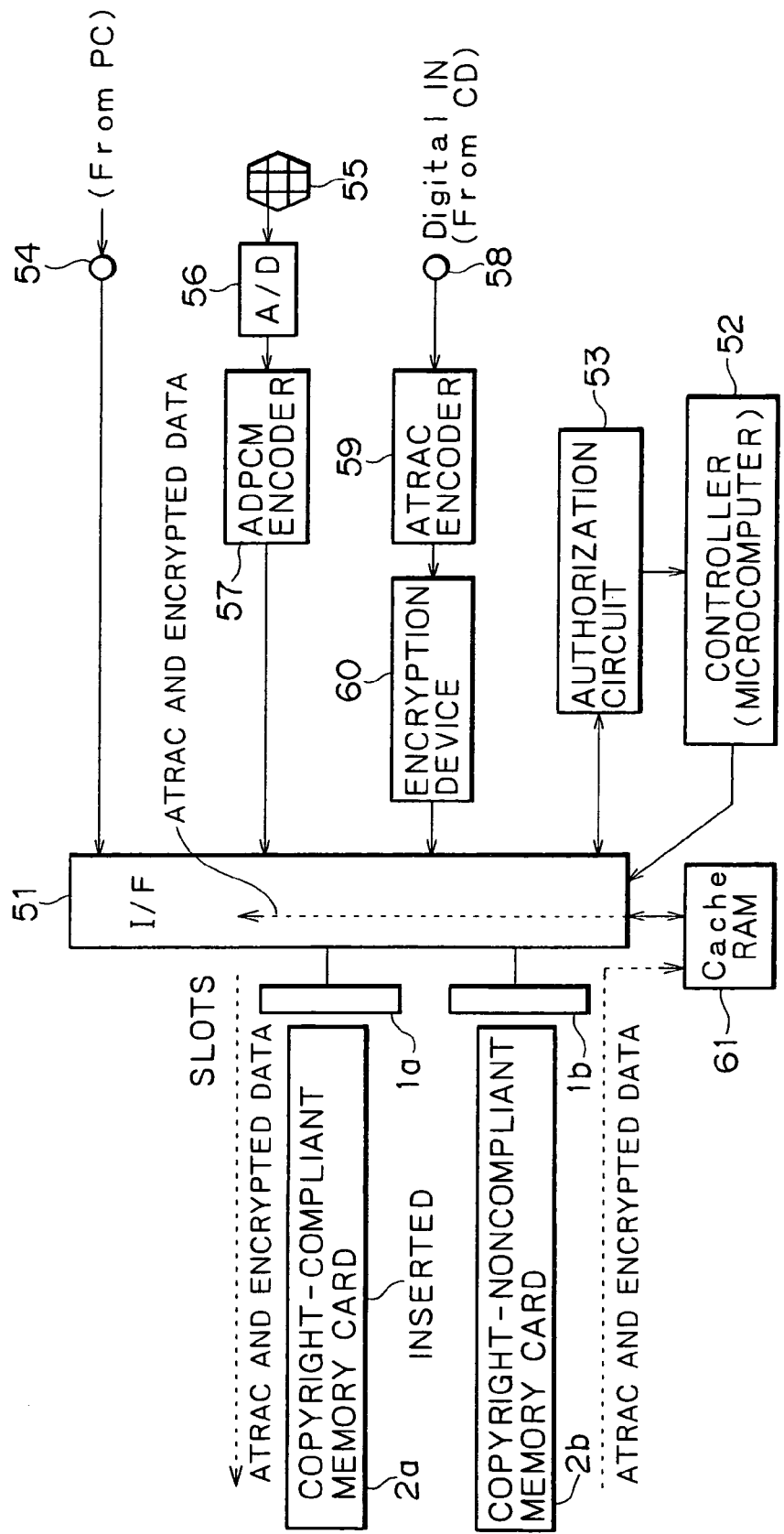
FIG. 11 is a block diagram of the inventive terminal apparatus in the music recording mode, showing flows of recording signals from the currently inserted copyright-noncompliant second memory card to the newly inserted copyright-compliant first memory card.

A second operation example (music recording mode) of this invention will now be described by referring to FIGS. 10 and 11. This example applies where the copyright-noncompliant memory card 2b is inserted with the music recording mode in effect. In FIGS. 10 and 11, those blocks with their equivalent or corresponding counterparts already shown in FIG. 4 are given the same reference numerals.

In the music recording mode, the connector 54 receives a digital audio signal (constituting a music file) which, coming illustratively from a personal computer, has been compressed and encrypted. The received signal is recorded to the inserted memory card via the interface circuit 51.

A music file is subject to copyright protection and should normally be recorded to the copyright-compliant memory card 2a. In the case of FIG. 10, however, only a copyright-noncompliant memory card 2b has been inserted, so that the music file is recorded to that memory card 2b for the moment.

Normally, data need not be encrypted when recorded to the copyright-noncompliant memory card 2b. In the above case, however, the music file is encrypted and recorded as ATRAC data.

When the music file is recorded to the copyright-noncompliant memory card 2b, the controller 52 waits until a copyright-compliant memory card 2a is inserted into the vacant slot 1a as shown in FIG. 11.

When the copyright-compliant memory card 2a is judged inserted into the slot 1a, a check is made to see if the memory card 2a has a sufficient available capacity (i.e., recordable area) to accommodate the music file.

If the sufficient memory capacity is judged to be available in the copyright-compliant memory card 2a, the recorded ATRAC data are retrieved from the copyright-noncompliant memory card 2b as shown in FIG. 11. The retrieved ATRAC data are written temporarily to the cache RAM 61 via the interface circuit 51. From the cache RAM 61, the ATRAC data are read out in suitable increments and copied to the newly inserted copyright-compliant memory card 2a.

After being copied to the copyright-compliant memory card 2a, the ATRAC data (i.e., music file) in the copyright-noncompliant memory card 2b may be erased if so desired. If the data are erased, this completes relocation of the recorded data from one memory card to another.

In the second operation example of this invention, as described, a copyright-noncompliant memory card 2b inadvertently inserted by the user in the music recording mode is arranged to accommodate temporarily the recorded music file. After the recording, the music file is relocated to a newly inserted copyright-compliant memory card 2a.

Even if the memory card 2b is used mistakenly by the user for recording data in the music recording mode (or if the memory card 2b is the only card available at the moment), the desired data are still recorded temporarily to the inserted memory card and thus will not be rejected thereby.

The same applies to the recording of data (music file) supplied through the line input terminal 58 from an external CD player or like equipment. Steps to achieve such recording are readily inferred and thus will not be described further.

In the steps above, the music file subject to copyright protection is stored, although temporarily, to the copyright-noncompliant memory card 2b. This does not mean, however, that copyrights have been infringed on.

That is, the copyright-noncompliant memory card 2b has no provisions for copyright protection and thus does not normally require data to be encrypted before recording. In the second operation example, however, the copyright-noncompliant memory card 2b is arranged to record the music file following encryption. Since the copyright-noncompliant memory card 2b does not have a decryption circuit or an authorization circuit comprising the security block 32 (see FIG. 2), the encrypted data will not be decrypted.

Figure 12:
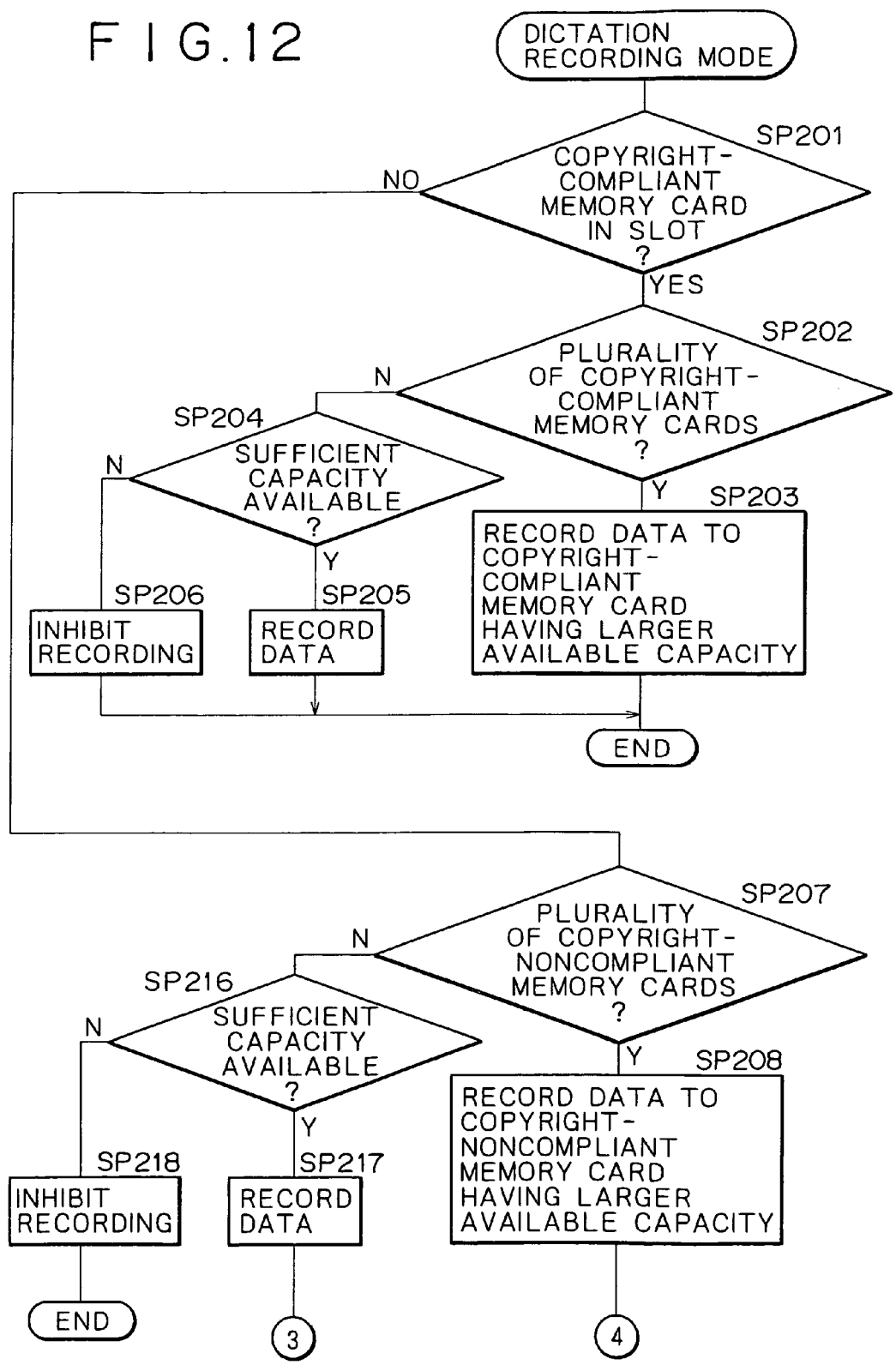
FIG. 12 is a flowchart of steps performed by the inventive terminal apparatus in the music recording mode.
Figure 13:
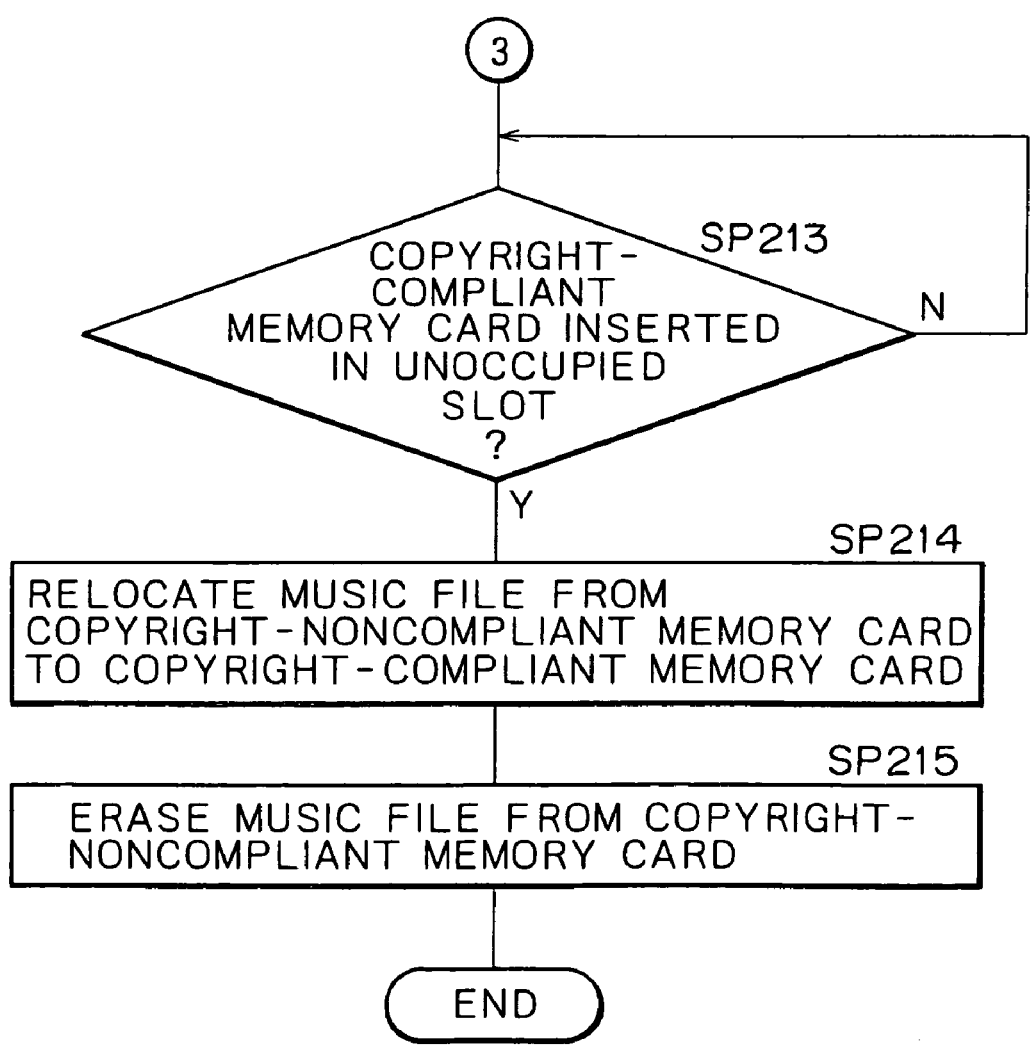
FIG. 13 is a flowchart of steps for relocating a music file from the copyright-noncompliant second memory card to the copyright-compliant first memory card.
Figure 14:
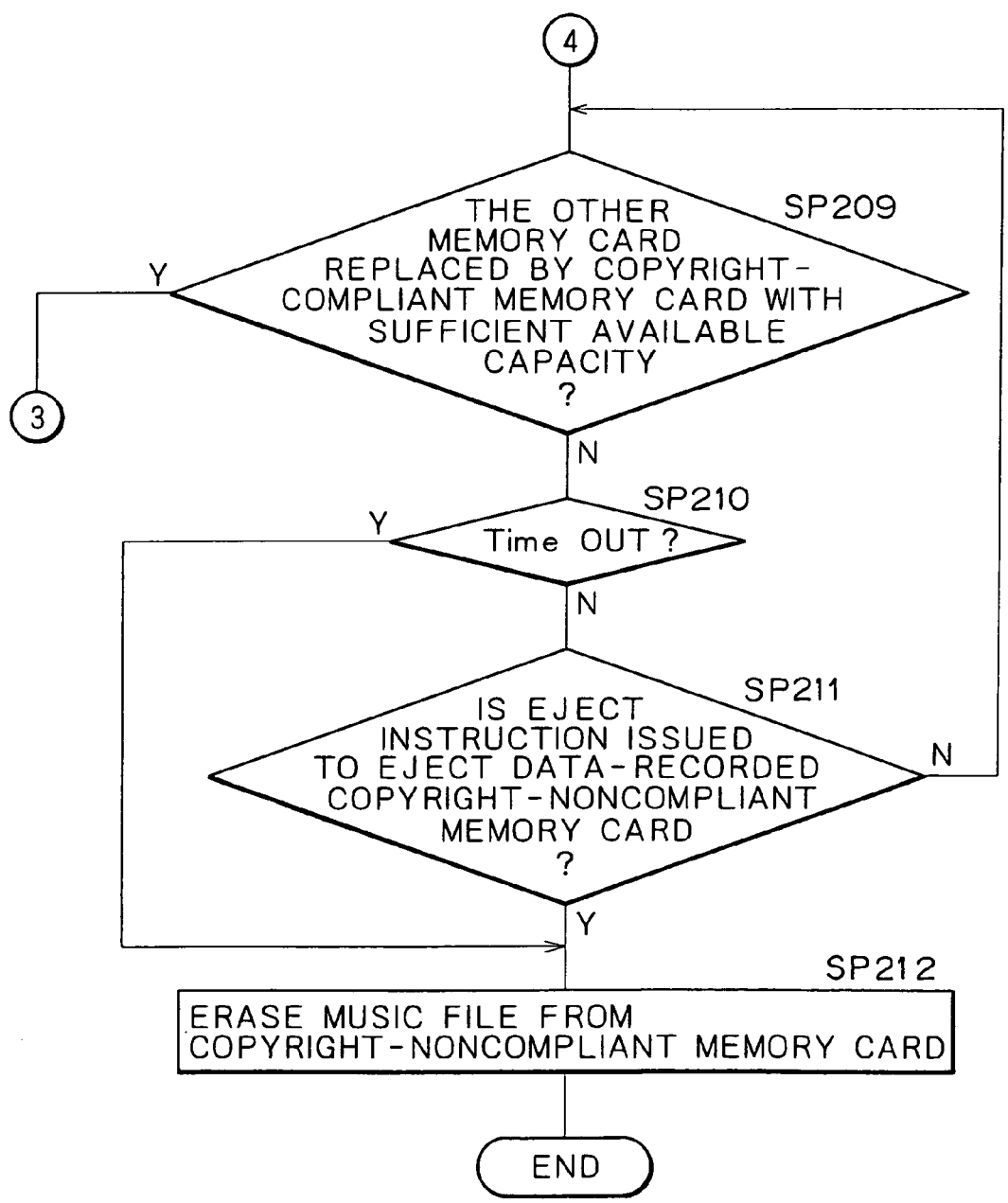
FIG. 14 is a flowchart of steps in effect when contents are not relocated from the copyright-noncompliant second memory card to the copyright-compliant first memory card.

FIGS. 12 through 14 are flowcharts of steps carried out by the controller 52 in the second operation example (music recording mode).

In step SP201, the controller 52 checks to see if a copyright-compliant memory card 2a has been inserted into one of the slots 1a and 1b.

If in step SP201 the copyright-compliant memory card 2a is found inserted in one of the slots, step SP202 is reached. In step SP202, a check is made to see if a plurality of copyright-compliant memory cards 2a have been inserted into the slots.

If in step SP202 a plurality of copyright-compliant memory cards 2a have been judged inserted, step SP203 is reached. In step SP203, the controller 52 starts recording a music file to one of the memory cards 2a which has the larger available capacity. The processing is terminated in response to a recording stop operation.

If in step SP202 a single copyright-compliant memory card 2a has been found inserted, step SP204 is reached. In step SP204, the controller 52 checks the available capacity of the memory card 2a. If the memory capacity is judged to be sufficient, the controller 52 goes to step SP205 and starts recording the music file. The processing is terminated in response to a recording stop operation.

If in step SP204 the available memory capacity is not judged to be sufficient, step SP206 is reached in which recording of the music file is inhibited. The processing is then terminated.

The steps above apply when the user has correctly inserted the copyright-compliant memory card or cards 2a. The music file is recorded in keeping with the available capacity of the inserted memory card(s) 2a.

There may be a case in which, with the music recording mode in effect, the user has inserted a copyright-noncompliant memory card or cards 2b into one or both of the slits 1a and 1b in place of the copyright-noncompliant memory card(s) 2b. In that case, the processing of the controller 52 proceeds as follows:

In step SP201, the controller 52 may judge that a copyright-noncompliant memory card 2b alone is inserted in one of the slots 1a and 1b instead of a copyright-compliant memory card 2a. Following that judgment, the controller 52 goes to step SP207 to determine whether a plurality of copyright-noncompliant memory cards 2b are inserted into the slots 1a and 1b.

If in step SP207 the multiple copyright-noncompliant memory cards 2b have been judged inserted, step SP208 is reached. In step SP208, the controller 52 starts recording the music file to one of the memory cards 2b which has the larger available capacity.

At the end of the recording of the music file in step SP207, step SP209 in FIG. 14 is reached by way of exit ④ in FIG. 12. In step SP209, the controller 52 waits until the other memory card not selected in step SP208, i.e., the copyright-noncompliant memory card 2b judged to have the smaller available capacity and not used for recording, is replaced by a new copyright-compliant memory card 2a with a sufficient available capacity.

In the wait state, the controller 52 counts the elapsed time using the internal timer. A time-out is monitored in step SP210.

In step SP211, a check is made to see if an eject instruction is issued illustratively by the user's operation in order to eject the copyright-noncompliant memory card 2b to which the data have been recorded.

It may happen that before a time-out is detected and before an eject instruction is issued to get the data-recorded copyright-noncompliant memory card 2b ejected, the data-unrecorded copyright-noncompliant memory card 2b is ejected from the slot; that a copyright-compliant memory card 2a is inserted into the vacated slot; and that the newly inserted memory card 2a is judged to have a sufficient available capacity. In that case, the processing of the controller 52 proceeds from step SP209 to step SP213 in FIG. 13 by way of exit ③ in FIG. 14.

In step SP213, a check is made to see if the replacement detected in step SP209 has resulted in the insertion of a copyright-compliant memory card 2a. If the memory card 2a is judged to have been inserted, steps SP214 and SP215 are reached in which the music file recorded to the copyright-noncompliant memory card 2b in step SP208 is relocated from there to the newly inserted copyright-compliant memory card 2a.

More specifically, in step SP214, the music file is copied to the copyright-compliant memory card 2a as shown in reference to FIG. 11. In step SP215, the music file is erased from the copyright-noncompliant memory card 2b. This completes relocation of the music file from the memory card 2b to the memory card 2a, and the processing is terminated.

It may instead happen that a time-out is recognized in step SP210 without detection of the data-unrecorded copyright-noncompliant memory card 2b and the copyright-compliant memory card 2a being switched in step SP209, or that an eject instruction is detected in step SP211 to get the data-recorded copyright-noncompliant memory card 2b ejected. In such cases, the music file cannot be relocated as indicated in FIG. 13.

Step SP212 is then reached in which the music file is erased anyway from the data-recorded copyright-noncompliant memory card 2b. The erasure brings the processing to an end.

If, in step SP207 of FIG. 12, a single copyright-noncompliant memory card 2b is judged inserted in the music recording mode, step SP216 is reached in which the memory card 2b is checked for its available capacity. If the memory card 2b is judged to have a sufficient available capacity, step SP217 is reached. In step SP217, the controller 52 starts recording the music file to the copyright-noncompliant memory card 2b. If in step SP216 the available capacity of the memory card 2b is judged to be insufficient, step SP218 is reached in which recording of the music file is inhibited, and the processing is terminated.

At the end of the recording in step SP217, the processing of the controller 52 proceeds from step SP217 to step SP213 in FIG. 13 by way of exit ③ in FIG. 12.

In step SP213, the controller 52 checks to see if (i.e., waits until) a copyright-compliant memory card 2a is inserted into the unoccupied slot.

If the copyright-compliant memory card 2a is judged inserted, steps SP214 and SP215 are reached in which the music file recorded to the copyright-noncompliant memory card 2b in step SP217 is relocated from there to the newly inserted copyright-compliant memory card 2a.

More specifically, in step SP214, the music file is copied to the copyright-compliant memory card 2a as shown in reference to FIG. 11. In step SP215, the music file is erased from the copyright-noncompliant memory card 2b. This completes relocation of the music file from the memory card 2b to the memory card 2a, and the processing is terminated.

The steps above are carried out in the music recording mode basically to record to the copyright-compliant memory card 2a the music file composed of audio signals coming from a personal computer or like sources. If a copyright-noncompliant memory card 2b alone is found inserted, the music file is recorded temporarily to that memory card 2b. Later, the recorded music file is relocated to a newly inserted copyright-compliant memory card 2a.

In the manner described, if the user inadvertently inserts a copyright-noncompliant memory card 2b, the desired music file can still be recorded despite the user's loading of the wrong type of memory card. The situation can be subsequently brought to normal when the music file is relocated to a copyright-compliant memory card 2a.

Supposing that the user completes a charging process to download chargeable copyright-protected contents (music file) and then inadvertently inserts a copyright-noncompliant memory card 2b preparatory to recording, the downloaded data are still recorded to the inserted memory card 2b so that the recorded data will later be relocated to a copyright-compliant memory card 2a. Thus the charging process performed by the user will not be in vain.

Supposing also that a copyright-noncompliant memory card 2b is inadvertently inserted preparatory to recording as a music file the digital signal coming from a CD player or like equipment following encryption, the admitted data are recorded temporarily to the inserted memory card 2b so that the music file will be relocated to a subsequently inserted copyright-compliant memory card 2a. Recording of the music file is thus guaranteed regardless of the type of memory card adopted for the moment. Because the copyright-compliant memory card 2a can be inserted (or can replace the memory card 2b) later in an unhurried fashion, there is no lopping of an initial portion of the music file due to a hasty switching of the improper memory card.

The copyright-protected music file placed temporarily in the copyright-noncompliant memory card 2b is erased in step SP212 or SP215 as described above. There will be no music file left in the subsequently ejected copyright-noncompliant memory card 2b. In the manner described, the embodiments or operation examples of this invention will not undermine but uphold established functions or provisions for copyright protection.

Although the description above contains many specificities, these should not be construed as limiting the scope of the invention but as merely providing illustrations of some presently preferred embodiments of this invention. It is to be understood that changes and variations may be made of structures, processing steps, target data to be recorded, and other aspects of the invention, without departing from the spirit or scope of the claims that follow.

For example, although the foregoing description referred primarily to dictations such as conference proceedings as typical contents not subject to copyright protection, this is not limitative of the invention. The contents not subject to copyright protection naturally include privately photographed still and moving pictures depicting landscapes, people, etc.

For purpose of illustration, the description above referred primarily to pieces of music from the PC, CD player, etc., as typical contents subject to copyright protection. The copyright-protected contents obviously include still and moving pictures from other media (such as DVD) as well.

Although the description above focused on a terminal apparatus comprising a plurality of slots, this is not limitative of the invention. A modified terminal apparatus may have a single slot and incorporate an internal nonvolatile memory having approximately the same capacity as that of a memory card to be inserted into that slot. The single slot may selectively accommodate either a copyright-compliant memory card or a copyright-noncompliant memory card. This modification works as follows:

If a copyright-compliant memory card is inserted into the single slot in the dictation recording mode, dictated contents are recorded temporarily to the inserted copyright-compliant memory card. The recorded contents are moved from the copyright-compliant memory card to the internal nonvolatile memory. Thereafter, the copyright-compliant memory card is released from the single slot and replaced by a copyright-noncompliant memory card inserted anew into the slot. The recorded dictations are then relocated from the internal nonvolatile memory to the newly inserted copyright-noncompliant memory card. Likewise, if a copyright-noncompliant memory card is inserted into the single slot in the music recording mode, music contents are recorded temporarily to the inserted copyright-noncompliant memory card. The recorded contents are moved from the copyright-noncompliant memory card to the internal nonvolatile memory. Thereafter, the copyright-noncompliant memory card is released from the single slot and replaced by a copyright-compliant memory card inserted anew into the slot. The recorded music is then relocated from the internal nonvolatile memory to the newly inserted copyright-compliant memory card.

This invention applies not only to Memory Stick (trademark) which is a copyright-compliant/noncompliant memory card proposed by this applicant, but also to memory card recording and reproducing apparatuses for use with such diverse flash memories as: Secured Multi Media Card (trademark of Infineon Technologies AG, Germany), a copyright-compliant/noncompliant memory card proposed by San disk and Hitachi Ltd.; SD Card (trademark of Infineon Technologies AG, Germany) proposed by San disk, Toshiba and Matsushita; and Compact Flash Memory Card (trademark) proposed by San disk.

As described, the inventive apparatus allows a plurality of memory cards to be inserted at the same time so that data can be copied or relocated easily from one memory card to another.

According to the invention, if a copyright-compliant memory card is inserted and if copyright-unprotected data (i.e., data not requiring copyright protection) are to be recorded, the data are written anyway to the inserted memory card so that the recorded data will later be relocated or copied to a copyright-noncompliant memory card. On the other hand, if a copyright-noncompliant memory card is inserted and if copyright-protected data (i.e., data requiring copyright protection) are to be recorded, the data are written anyway to the inserted memory card so that the recorded data will later be relocated or copied to a copyright-compliant memory card.

Because the copyright-noncompliant and copyright-compliant cards are substantially the same in appearance, the user can inadvertently insert the wrong type of memory card into the apparatus preparatory to recording. In such cases, the features and arrangements of the invention still allow the desired contents to be recorded and preserved successfully.

As many apparently different embodiments of this invention may be made without departing from the spirit and scope thereof, it is to be understood that the invention is not limited to the specific embodiments thereof except as defined in the appended claims.

What is claimed is:

1. A terminal apparatus comprising:
    an insertion hole into which is inserted a first memory card being a copyright-protected memory card enabled to store both copyright protected contents and copyright unprotected contents and a second memory card being a copyright-unprotected memory card capable of only storing copyright unprotected contents;
    judging means for judging whether the inserted memory card is copyright-protected when a normal response is obtained within a predetermined period of time during an authorization process;
    recording means which, if said judging means judges that said first memory card is inserted prior to recording copyright-unprotected contents, then said recording means temporarily records said copyright-unprotected contents to said first memory card for a predetermined period of time; and
    controlling means which, if said second memory card is inserted into the insertion hole after said recording means has recorded said copyright-unprotected contents to said first memory card, said controlling means automatically transfers the recorded copyright-unprotected contents from said first memory card to the inserted second memory card.

2. A terminal apparatus according to claim 1, wherein said insertion hole has a plurality of slots into which a plurality of memory cards may be inserted concurrently.

3. A terminal apparatus according to claim 1, wherein said insertion hole has a single slot which accommodates only one memory card and into which said first memory card is inserted to have said copyright-unprotected contents recorded thereto by said recording means, before said first memory card is removed from said insertion hole and replaced by said second memory card inserted therein.

4. A terminal apparatus according to claim 1, wherein said copyright-protected contents include a copyright-protected file storing at least one of three categories of contents composed of music, videos, and games, provided by copyright holders.

5. A terminal apparatus according to claim 1, wherein said copyright-unprotected contents are constituted by copyright-free software.

6. A terminal apparatus according to claim 5, wherein said copyright-free software is made up of privately produced contents.

7. A terminal apparatus according to claim 1, wherein said controlling means transfers the recorded copyright-unprotected contents from said first memory card to said second memory card inserted in said insertion hole, before erasing said copyright-unprotected contents from said first memory card.

8. A terminal apparatus according to claim 1, further comprising
    comparing means for comparing a recordable capacity of said second memory card inserted in said insertion hole with the capacity of said copyright-unprotected contents recorded in said first memory card;
    wherein said controlling means permits the transfer of the recorded contents between the memory cards if said recordable capacity of said second memory card is judged to be greater than the capacity of the recorded copyright-unprotected contents in said first memory card upon comparison by said comparing means, said controlling means inhibiting said transfer if said recordable capacity of said second memory card is judged to be less than the capacity of the recorded copyright-unprotected contents in said first memory card upon comparison by said comparing means.

9. A terminal apparatus according to claim 1, further comprising:
    a microphone;
    A/D converting means for converting an analog audio signal picked up by said microphone into a digital audio signal; and
    compression processing means for subjecting to a predetermined compression process said digital audio signal following the conversion by said A/D converting means;
    wherein the compressed digital audio signal from said compression processing means is recorded to said second memory card as copyright-unprotected contents.

10. A recording method for use with a terminal apparatus comprising an insertion hole into which is inserted a first memory card being a copyright-protected memory card enabled to store both copyright protected contents and copyright unprotected contents and a second memory card being a copyright-unprotected memory card enabled to store only copyright unprotected contents, said recording method comprising the steps of:
    judging whether the inserted memory card is copyright-protected when a normal response is obtained within a predetermined period of time during an authorization process;
    if said first memory card is judged to be inserted prior to recording copyright-unprotected contents by a recording means, then said recording means temporarily records said copyright-unprotected contents to said first memory card for a predetermined period of time; and if said second memory card is inserted into the insertion hole after said copyright-unprotected contents have been recorded to said first memory card by a controlling means, said controlling means automatically transfers the recorded copyright-unprotected contents from said first memory card to the inserted second memory card.

11. A recording method according to claim 10, further comprising the step of transferring the recorded copyright-unprotected contents from said first memory card to said second memory card inserted in said insertion hole, before erasing said copyright-unprotected contents from said first memory card.

12. A recording method according to claim 10, further comprising the steps of:
  comparing a recordable capacity of said second memory card inserted in said insertion hole with the capacity of said copyright-unprotected contents recorded in said first memory card;
  permitting the transfer of the recorded contents between the memory cards if said recordable capacity of said second memory card is judged to be greater than the capacity of the recorded copyright-unprotected contents in said first memory card upon comparison; and
  inhibiting said transfer if said recordable capacity of said second memory card is judged to be less than the capacity of the recorded copyright-unprotected contents in said first memory card following the comparison.

13. A terminal apparatus comprising:
  an insertion opening into which is insertable a first memory card being a copyright-protected memory card enabled to store both copyright protected contents and copyright unprotected contents and a second memory card being a copyright-unprotected memory card enabled to store only copyright unprotected contents;
  judging means for judging whether an inserted memory card is copyright-protected when a normal response is obtained within a predetermined period of time during an authorization process;
  recording means which, if said judging means judges that said first memory card is inserted prior to recording copyright-unprotected contents, then said recording means temporarily records said copyright-unprotected contents to said first memory card for a predetermined period of time; and
  controlling means which, if said second memory card is inserted into the insertion opening after said recording means has recorded said copyright-unprotected contents to said first memory card, said controlling means automatically transfers the recorded copyright-unprotected contents from said first memory card to the inserted second memory card,
  wherein, in response to an instruction to eject the first memory card, the controlling means causes erasure of the copyright-unprotected contents from the first memory card.

14. The terminal apparatus of claim 13, further comprising:
  a timer to provide a time-out signal after a predetermined interval of time has elapsed from recording of the copyright-unprotected contents to the first memory card, and
  wherein the controlling means, in response to the time-out signal, erases the copyright-unprotected content from the first memory card.

15. A recording method for use with a terminal apparatus comprising an insertion opening into which is insertable a first memory card being a copyright-protected memory card enabled to store both copyright protected contents and copyright unprotected contents and a second memory card being a copyright-unprotected memory card enabled to store only copyright unprotected contents, the first and second memory cards being substantially the same in shape, said recording method comprising the steps of:
  judging whether an inserted memory card is copyright-protected when a normal response is obtained within a predetermined period of time during an authorization process;
  if said first memory card is judged to be inserted prior to recording copyright-unprotected contents by a recording means, then said recording means temporarily records said copyright-unprotected contents to said first memory card for a predetermined period of time;
  if said second memory card is inserted into the insertion opening after said copyright-unprotected contents have been recorded to said first memory card by a controlling means, said controlling means automatically transfers the recorded copyright-unprotected contents from said first memory card to the inserted second memory card; and
  if an instruction is received to eject the first memory card prior to insertion of the second memory card, the controlling means causes erasure of the copyright-unprotected contents from the first memory card.

16. The recording method of claim 14, further comprising:
  automatically erasing the copyright-unprotected content from the first memory card in response to a time-out signal provided by a timer after a predetermined interval of time has elapsed from recording of the copyright-unprotected contents to the first memory card without the copyright-unprotected contents being transferred to the inserted second memory card.

17. A recording method, comprising:
  judging whether an inserted first memory card is enabled to store both copyright protected contents and copyright protected contents;
  recording copyright-unprotected contents to the first memory card when said first memory card is judged to be enabled to store both copyright protected contents and copyright unprotected contents;
  judging whether an inserted second memory card is enabled to store only copyright unprotected contents;
  automatically transferring the copyright-unprotected contents to the second memory card in response to judging said second memory card is enabled to store only copyright unprotected contents; and
  automatically erasing the copyright-unprotected contents from the first memory card in response to receiving an instruction to eject the first memory card.

* * * * *